US006933867B2

(12) United States Patent
Honda

(10) Patent No.: US 6,933,867 B2
(45) Date of Patent: Aug. 23, 2005

(54) A/D CONVERSION PROCESSING APPARATUS PROVIDING IMPROVED ELIMINATION OF EFFECTS OF NOISE THROUGH DIGITAL PROCESSING, METHOD OF UTILIZING THE A/D CONVERSION PROCESSING APPARATUS, AND ELECTRONIC CONTROL APPARATUS INCORPORATING THE A/D CONVERSION PROCESSING APPARATUS

(75) Inventor: Takayoshi Honda, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/986,063

(22) Filed: Nov. 12, 2004

(65) Prior Publication Data

US 2005/0102334 A1 May 12, 2005

(30) Foreign Application Priority Data

Nov. 12, 2003 (JP) ............................ 2003-382756
Jul. 26, 2004 (JP) ............................ 2004-217805

(51) Int. Cl.[7] ............................................ H03M 1/06
(52) U.S. Cl. ....................... 341/118; 341/120; 341/155
(58) Field of Search ....................... 341/118, 120, 139, 341/140, 142, 155

(56) References Cited

U.S. PATENT DOCUMENTS 4,032,914 A * 6/1977 Candy et al. ............... 341/156
5,025,259 A 6/1991 Abe .......................... 341/118
5,530,373 A * 6/1996 Gibson et al. ............. 324/758
6,016,112 A * 1/2000 Knudsen ..................... 341/118
6,049,298 A * 4/2000 Knudsen ..................... 341/118
6,369,857 B1 * 4/2002 Balaban et al. ............ 348/555
6,614,378 B2 * 9/2003 Miyazaki et al. .......... 341/155
6,690,311 B2 * 2/2004 Lundin et al. ............. 341/120

FOREIGN PATENT DOCUMENTS

| | | | |
|---|---|---|---|
| JP | 56-34225 | 4/1981 | .......... H03K 13/02 |
| JP | 5-63127 | 8/1993 | .......... H03M 1/12 |
| JP | 10-209862 | 8/1998 | .......... H03M 1/08 |
| JP | 2828106 | 9/1998 | .......... F02D 45/00 |
| JP | 2852059 | 11/1998 | .......... F02D 45/00 |
| JP | 11-62689 | 3/1999 | .......... F02D 45/00 |

* cited by examiner

*Primary Examiner*—Michael Tokar
*Assistant Examiner*—Linh Van Nguyen
(74) *Attorney, Agent, or Firm*—Nixon & Vanderhye P.C.

(57) ABSTRACT

In an A/D conversion control apparatus for use in an electronic controller such as an engine ECU of a vehicle, each of successive sets of A/D converted values of an analog signal (each set comprising 3 or more values) is processed to obtain a median value of the set, and the median values are subjected to digital smoothing processing to obtain successive final result values, with effects of noise contained in the analog signal being effectively excluded. The final result values are suitable as control data, supplied to a control device such as a microcomputer of an ECU.

38 Claims, 21 Drawing Sheets

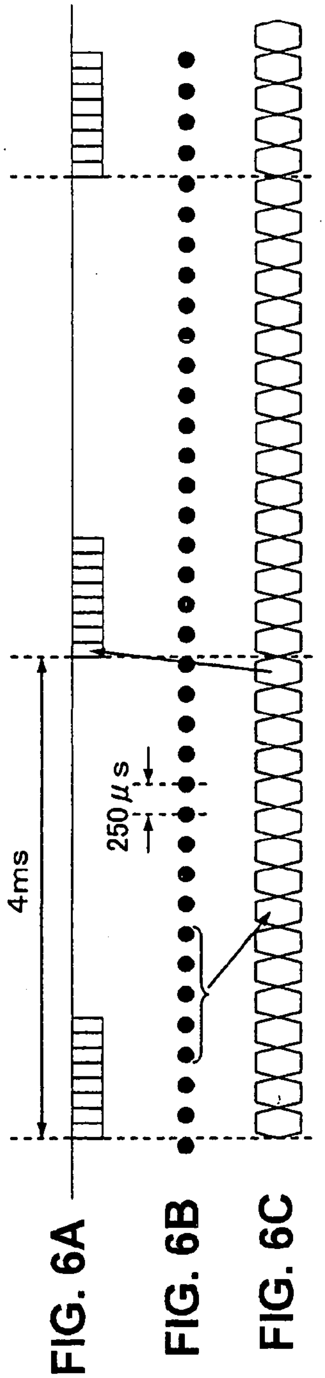
FIG. 6A
FIG. 6B
FIG. 6C
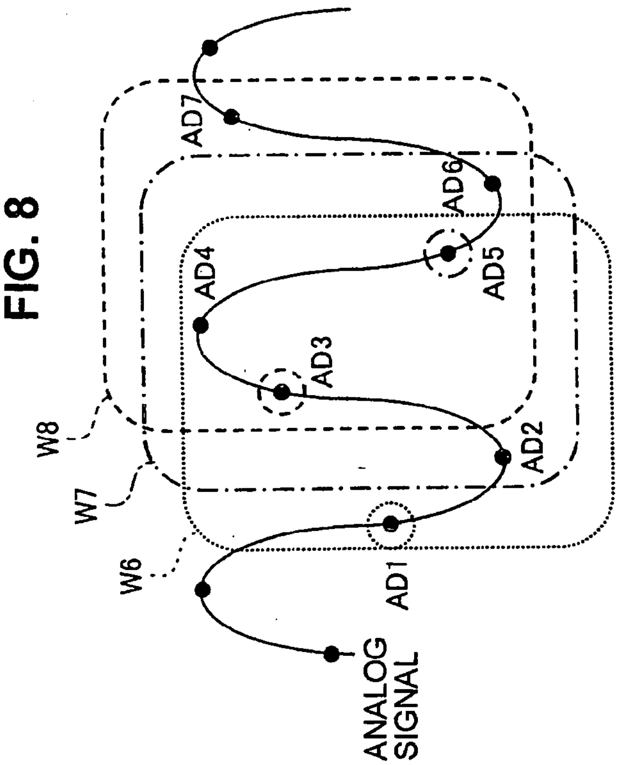
FIG. 8

FIG. 18A

| | COMMAND | OTHER CONTENTS OF REQUEST |
|---|---|---|
| REGISTER VALUE SETTING REQUEST | 00 | CHANNEL NUMBER, SEL, Nms, Tmg |
| DATA ACQUISITION REQUEST | 10 | —— |
| SINGLE-SHOT A/D CONVERSION REQUEST | 11 | CHANNEL NUMBER |

FIG. 18B

| | | | |
|---|---|---|---|
| SEL | Nms | Tmg | DATA OF PROCESSING RESULTS RAM (15c) |

A/D CONVERSION PROCESSING APPARATUS PROVIDING IMPROVED ELIMINATION OF EFFECTS OF NOISE THROUGH DIGITAL PROCESSING, METHOD OF UTILIZING THE A/D CONVERSION PROCESSING APPARATUS, AND ELECTRONIC CONTROL APPARATUS INCORPORATING THE A/D CONVERSION PROCESSING APPARATUS

CROSS-REFERENCE TO RELATED APPLICATIONS

This application is based on and incorporates herein by reference Japanese Patent Application No. 2003-382756 filed on Nov. 12, 2003 and 2004-217805 filed on Jul. 26, 2004.

BACKGROUND OF INVENTION

1. Field of Application

The present invention relates in general to A/D (analog-to-digital) conversion of an analog signal to a digital signal, and in particular to an A/D conversion processing apparatus which applies digital processing to exclude the effects of noise in the analog signal from the digital signal.

2. Description of Prior Art

In the prior art, for example in the case of an electronic control apparatus such as an engine ECU (electronic control unit) of a vehicle, a number of signals are acquired by the ECU and subjected to various forms of processing, with the signals being produced by respective sensors which detect the engine operating condition. Some of these signals, such as those of a crank angle sensor or engine speed sensor may be digital signals, while others are analog signals, such as those from an air intake rate sensor, a throttle position sensor, water temperature sensor, etc. The processing results derived by the ECU are used to control fuel injection and ignition timing, etc., of the vehicle engine. Since the operation of the ECU is based on a microcomputer, which cannot directly use analog signals, these are converted to respective digital signals by an A/D converter.

Such a vehicle ECU must operate in an environment in which high levels of electrical noise are generated, such as spark noise from the ignition system, noise produced by switching operation of power transistors, noise produced from motor brushes, noise in the form of induced currents resulting from external magnetic fields such as those of a starter motor, etc.

For that reason, in the prior art, each analog signal that is to be subjected to A/D conversion in a vehicle ECU is first subjected to noise removal processing by filtering, using a filter circuit such as an RC (resistor and capacitor) filter, before being inputted to the A/D converter. However in recent years, there has been a substantial increase in the extent to which control of the engine and other equipment of a vehicle is performed by an ECU, with a corresponding increase in the number of analog signals that must be acquired and processed. If it is necessary to provide respective filter circuits for each of the analog signals then the scale and manufacturing cost of the ECU becomes substantially increased.

For that reason, it has been proposed in the prior art to omit these analog filter circuits, and to perform direct removal of noise from the digital signals produced by the A/D converter, i.e., by a digital noise removal method. Such methods are described for example in Japanese Patent Laid-open No. 11-62689 and Japanese Patent Nos. 2852059 and 2828106, which will be referred to in the following as reference 1, reference 2 and reference 3, respectively.

In the following, the term "control input data" refers to a series of digital values (i.e., control input values) that are derived based on A/D conversion and are used for control purposes, e.g., are supplied to a microcomputer which performs control operations of an ECU.

In the case of reference 1, the difference between the immediately preceding A/D converted value (i.e., digital value produced by an A/D converter) and the currently derived A/D converted value is obtained as the currently derived difference value DIF1. If DIF1 does not exceed the immediately precedingly derived difference value DIF0 by more than a predetermined amount, then DIF1 is used as the currently derived control input value. If DIF1 exceeds DIF0 by more than the predetermined amount, then this is taken to indicate that the magnitude of DIF1 has resulted from noise, and is not to be used as the currently derived control input value. Instead, the immediately precedingly derived difference value DIF0 is outputted in place of DIF1.

In the case of reference 2, instead of the usual manner of sampling the input analog signal once in each of successive time intervals, to perform successive A/D conversions, a set of two or more samples is derived once in each of successive time intervals, so that successive sets of A/D converted values are obtained. Within each set, the number of values and the period between deriving successive values are determined such as to attempt to ensure that there will be only a low probability that more than one A/D converted value within the set will be affected by noise. That is to say, there should be only a low probability that two or more successive noise peaks or bursts contained in the input analog signal will occur within the duration of one of these sets of A/D converted values. The values in each set are mutually compared, and if one of these is excessively different from the other values in the set, then it is judged to be a result of noise, and is discarded. The currently derived control input value is then obtained as the average of the remaining values in that set. If none of the values in a set is excessively different from the others, then the average of the values in the set is obtained, as the currently derived control input value.

In the case of reference 3, each of a plurality of successively obtained A/D converted values is compared with a previously derived control input value, and the A/D converted value for which the smallest amount of difference is obtained is utilized as the currently derived control input value.

However each of the techniques of references 1 to 3 have disadvantages. Firstly in the case of reference 1, it is difficult to establish a suitable value for the aforementioned predetermined amount that is used as a basis for comparison. If that amount is made excessively large, then noise will not be accurately detected, while conversely if the amount is too small, then sudden changes in the input analog signal will be erroneously detected as noise.

In the case of reference 2, it is necessary to ensure that there is no more than one abnormal value (i.e., which has been affected by noise) within each of the aforementioned sets of A/D converted values. Hence it is difficult to apply such a method to a system in which input analog signals having various different noise characteristics must be processed.

For example as illustrated in FIG. 22A, if there are two or more abnormal values within the set of A/D converted values that is currently being processed, then the noise reduction effectiveness is greatly decreased. Specifically, with the values AD1, AD2 and AD3 being currently processed as a set, there are values (AD2, AD3) that are abnormally high as a result of noise. If, as shown, the difference between these two abnormal values AD2, AD3 is small, then the average of these two values will become the currently derived control input value, which will be used for control purposes. In the example of FIG. 22A, the value AD2 which is the largest of the three values (due to the effects of noise) will have a substantial effect upon the currently derived control input value, so that it is possible for noise to have a significant effect upon the control operation.

In the case of reference 3, FIG. 22B illustrates a condition in which an immediately precedingly derived control input value (obtained as an average, as described above) is designated as ADOLD, and the set of A/D converted values that are currently being examined are designated as ADNEW1, ADNEW 2, ADNEW3, with these values decreasing monotonically. FIG. 22C on the other hand illustrates a condition in which one of the set of three A/D converted values (ADNEW3) is abnormally high, due to noise, and approaches the magnitude of ADOLD. As a result, this abnormally high value ADNEW3 will be selected as a valid result, and so will be used as the currently derived control input value. Furthermore, as a result of this, the abnormally high value ADNEW3 will become the reference value which is used for comparison with the next set of A/D converted values, to determine the next control input value. Hence, the effects of even a single abnormal A/D converted value due to noise may propagate to subsequent processing that is performed for deriving successive control input values.

SUMMARY OF THE INVENTION

It is an objective of the present invention to overcome the above problems of the prior art, by providing an A/D conversion processing apparatus whereby the effects of noise in an input analog signal are substantially eliminated from a series of digital values representing that signal.

According to a first aspect, the invention provides an A/D conversion processing apparatus whereby an A/D converter means operates on an analog signal to obtain A/D converted values expressing voltage values of the analog signal, to be used in control operations by an external apparatus (in general, a microcomputer). After a first set of m digital values produced from the A/D converter means (m being an integer of value 3 or more) have been stored in converted data memory means, then each time that the contents of the converted data memory means are updated, a data detection means detects a specific-rank value within the set of m digital values (i.e., having a specific rank with respect to magnitude, when the m values are arranged in order of magnitude). Each specific-rank value is detected as a digital value that is intermediate between a largest magnitude and a smallest magnitude of the set of m values, with the specific-rank values being successively stored in final result memory means, as respective final result values. All or part of the successively derived final result values are used as respective control input values, in the aforementioned control operations.

In the following, such "final result values" will be generally referred to simply as "final values", for brevity of description.

It can thereby be ensured that each digital value that is stored as a final value has not been made excessively large or excessively small as a result of electrical noise contained in the analog signal, so that such noise can be prevented from affecting the aforementioned control operations, e.g., control operations performed by a microcomputer.

Problems of the prior art can thereby be avoided, such as those which occur when exclusion of noise from the digital values produced from an A/D converter is based upon using a predetermined amount as a basis for comparison of respective digital values, as in the case of reference 1 above. Furthermore the prior art problems of references 2 and 3 described hereinabove are also avoided, i.e., whereby an A/D converted value that is selected as a final value, to be used as control input value, may be affected by A/D converted values that are excessively large or excessively small as a result of noise contained in the analog signal and which are closely adjacent to that final value along the time axis.

Moreover, with the present invention, even if there are very large-scale variations in magnitude of the input analog signal, which would be difficult or impossible to eliminate by transferring the analog signal through an analog filter circuit such as a low-pass filter prior to performing A/D conversion, the effects of such large-scale variations can be effectively excluded from affecting the final values that are to be utilized for control purposes.

If the aforementioned value m is made an odd number, then each specific-rank value can be selected as being the median value (with respect to amplitude) of the most recently derived set of m successive A/D converted values of the analog signal.

In some special cases, such as when the analog signal contains greater amounts of noise when it attains a large amplitude, it may be preferable to select a one of the set of m A/D converted values that is smaller than the median value. However, in general, it is preferable to select each specific-rank value as the median value, since this provides optimum results for analog signals which may have various different forms of noise characteristics.

From another aspect, such an A/D conversion processing apparatus can be configured such that instead of the specific-rank values being successively stored in the second memory means, to be used as control input data, the data processing means performs smoothing processing of the specific-rank values, to reduce variations in magnitude between successive ones of these values, with the result values obtained from the smoothing processing being stored in the final result memory means as the final values. The smoothing processing may consist for example of factor-based averaging (as described hereinafter) or moving-average processing, etc.

This enables noise contained in the analog signal to be even more effectively excluded from affecting the final values.

From another aspect, if the aforementioned value m is made an even-numbered integer of 4 or greater, the data detection means can be configured to detect a plurality of digital values from among each set of m digital values, such that each of the plurality of digital values is neither the largest in magnitude nor the smallest in magnitude of the m values. With m being an even number, none of the digital values can be a median value, and so in that case, the average of each such plurality of digital values can be calculated, with the result values obtained from the averaging being stored in the second memory means as the final values that are used for control purposes. In general, it is preferable to select the plurality of digital values such that each is close to being midway between the largest and smallest of the set of m digital values, since this provides optimum results for analog signals which may have various different forms of noise characteristics.

Alternatively, when m is an even-numbered integer, the data detection means can be configured to detect the (m/2)-th and the {(m/2)+1)-th values (i.e., counting from the largest value, or from the smallest value) in each set of m digital values, and obtain the average of these two values to thereby obtain a final value.

As a further alternative, a sub-set of values are selected (from within the set of m digital values) that successively increase in magnitude, and that include the aforementioned (m/2)-th and the {(m/2)+1)-th ranked values, and the average of that sub-set is then calculated, to be stored as a final value.

Furthermore if m is made an odd-numbered value, then the data detection means can similarly be configured to select a sub-set of the set of m digital values, i.e., a plurality of values that are of successively increasing magnitude, that include the median value of the m digital values. The average of each such plurality of digital values is calculated, to be stored as a final value.

In each of the above cases, digital smoothing processing can be applied to the successive average values that are derived as described above, with the result values obtained from the smoothing processing being stored as the final values.

Especially in the case of an apparatus that is used in a motor vehicle, the noise that is present in an analog signal which is supplied to the apparatus may vary periodically, such as noise which is generated by the ignition system of a vehicle and which therefore occurs with a repetition period that varies in accordance with the speed of the vehicle engine. As a result, the timings of noise occurrences in the analog signal may become synchronized with the timings of A/D conversions performed on the analog signal, if such timings occur with a fixed period, as is usual in the prior art. Hence, the digital value produced by the A/D conversion operations will become strongly affected by the noise.

According to another aspect of the present invention, to overcome the above problem, the aforementioned A/D conversion means of the A/D conversion processing apparatus performs A/D conversions of the analog signal with a conversion period (i.e., interval between successive A/D conversions of that analog signal) that varies in duration. The probability of the A/D converted values becoming affected by periodically occurring noise in the analog signal is thereby made extremely small, so that the effectiveness of noise exclusion is substantially enhanced.

The A/D conversion period can be varied randomly, i.e., based on random number generating being performed prior to each A/D conversion of that analog signal, or can have a variation sequence that recurs cyclically.

When a plurality of analog signals are sequentially subjected to A/D conversion, with each sequence of conversions beginning at successive periodic time points, then the A/D conversion period of each of these signals can be varied by altering the sequence of conversions, prior to each of the periodic time points. This can be performed by selecting one of a plurality of possible sequences (i.e., with the number of that plurality being determined by the number of analog signals) prior to each of the periodic time points, with that selection being randomly determined, or performed with a fixed sequence that cyclically recurs.

From another aspect, an A/D conversion processing apparatus according to the present invention can be provided with data communication means for communicating with a control apparatus, with that control apparatus generally being a microcomputer. The control apparatus receives successive sets of one or more final values (i.e., as control input values) transmitted from the A/D conversion processing apparatus, for each of one or more analog signals, and performs control of a control object such as a vehicle engine based on the received values.

In that case, each of the means of the A/D conversion processing apparatus other than the communication means can operate at timings that are independent of operation timings of the control apparatus. In addition, the control apparatus can transmit a data acquisition request to the A/D conversion processing apparatus, with the A/D conversion processing apparatus responding by transmitting to the control apparatus a most recently derived set of the final values that have been stored in the final result memory means.

In that way, although the contents of the final result memory means are updated at timings that are independent of the timings of data communication between the A/D conversion processing apparatus and the control apparatus, it can be ensured that a most recently derived set of final values will be transmitted to the control apparatus each time such data communication is performed.

Alternatively, it can be arranged that the A/D conversion processing apparatus communicates with the control apparatus at successive timings occurring at fixed periodic intervals, and that all sections of the A/D conversion processing apparatus other than the communication means repetitively begin to operate at successive timings that each precede (by a fixedly predetermined interval) a corresponding one of the timings of communication with the control apparatus, so that a final value (or set of final values respectively derived for a plurality of analog signals) is obtained and stored in the final result memory means immediately prior to beginning of each communication. During each communication, the A/D conversion processing apparatus transmits the most recently stored final value(s) to the control apparatus.

In that case, the rate of performing A/D conversions can be substantially reduced, so that the power consumption of the electronic control apparatus can be correspondingly reduced.

The duration of the aforementioned fixedly predetermined interval is preferably made as short as possible, but longer than the time required to derive a final value and to update the contents of the final result memory means accordingly.

From another aspect, the invention provides an A/D conversion processing apparatus having a plurality of input terminals, each coupled to a corresponding one of a plurality of analog signals, and multiplexing means for successively selecting the analog signals for A/D conversion. In a first sub-set of these input terminals (comprising at least one terminal) each terminal is coupled to a corresponding filter circuit through which the corresponding analog signal is transferred to that input terminal, for reducing electrical noise that may be contained in the analog signal. In a second sub-set of the input terminals (comprising at lest one terminal) each analog signals is applied directly to the corresponding terminal.

In the case of each analog signal that is coupled to one of the second set of input terminals, the operations described hereinabove are performed by the converted data memory means and the data detection means, etc., are applied the A/D converted values obtained for that analog signal, to thereby obtain successive final values expressing that analog signal. In the case of each analog signal that is coupled via a filter circuit to one of the first set of input terminals, at least the operations performed by the data detection means are omitted from being applied to the A/D converted values obtained for that analog signal, when deriving successive final values expressing that analog signal.

In that way, it becomes possible to apply an appropriate form of noise removal processing to each analog signal in accordance with the particular characteristics of that signal.

Specifically, it is preferably arranged that each analog signal which is coupled via a filter to one of the first set of input terminals is selected as being a signal which varies substantially abruptly, i.e., that has a maximum rate of change of amplitude that is relatively high (such as a signal of an engine cylinder pressure sensor), while each analog signal that is coupled to one of the second set of input terminals is selected as being a signal which only varies relatively gradually, i.e., having a maximum rate of change of amplitude that is relatively small (such as a signal of an engine coolant temperature sensor), by comparison with the analog signals that are coupled to the first set of input terminals.

By omitting to apply digital noise processing such as derivation of median values as described above, for an analog signal which exhibits abrupt variations in amplitude, and instead using an analog filter circuit having characteristics which are appropriate, it can be ensured that the noise removal processing will not result in valid portions of the analog signal being erroneously rejected as noise. However in the case of an analog signal which varies only gradually, sufficiently effective noise removal can be achieved by digital processing (in particular, selection of median values as described hereinabove), without the danger of erroneous rejection of valid signal values, and without requiring the use of an analog filter circuit, so that the total number of analog filter circuits can be minimized.

Furthermore with such an A/D conversion processing apparatus having both input terminals whereby each input analog signal is directly supplied to the A/D conversion means and also input terminals whereby each input analog signal is transferred via a filter circuit to the A/D conversion means, an analog signal whose variations are not synchronized with any timebase (for example, a signal which detects when an engine crankshaft attains a specific angular position) can be advantageously applied via a filter circuit to one of the first set of input terminals.

With such an A/D conversion processing apparatus, when an input analog signal is produced based on voltage division of a power supply voltage of the A/D conversion means, it is preferable that such an analog signal is directly supplied to one of the second set of input terminals, without utilizing a filter circuit. The reason for this is as follows. Such a filter circuit generally includes one or more capacitors that are connected between the signal line of the input analog signal and circuit ground potential. If abrupt changes in level of the power supply voltage occur (e.g., due to noise in that voltage), then these changes will be absorbed by the capacitor of the filter circuit, so that no corresponding changes in the input analog signal will occur. Hence, the proportional relationship of the voltage division will not be maintained, so that accurate A/D conversion cannot be achieved.

From another aspect, an A/D conversion processing apparatus according to the present invention may include data register means, for use as a register for storing respective values for the aforementioned number m, etc. That is to say, that number m, and the duration of the interval between successive A/D conversions, are made respective variable quantities, whose values are supplied from an external source, and stored in the data register means. In the following description and in the appended claims, a "variable quantity" will be referred to simply as a "variable", for brevity of description.

In that way, various different values for these variables can readily be arbitrarily set (e.g., by being transmitted to the A/D conversion processing apparatus from a control apparatus that performs control operations based on the aforementioned final values). Hence, an ECU formed by combining such an A/D conversion processing apparatus with a control apparatus such as a microcomputer can be used in a wide variety of different applications.

For example it can be arranged that the control apparatus supplies initial values for the variables to the A/D conversion processing apparatus (to be respectively stored in the data register means) when operation of the ECU is started. In addition, it becomes possible for the control apparatus to update the values of these variables in accordance with the current condition of the control object (e.g., a vehicle engine), on one or more occasions after operation of the ECU has started, so that flexibility of operation can be achieved.

Furthermore such an ECU can be configured such that the control apparatus obtains from the A/D conversion processing apparatus (on one or more occasions after the initial values have been supplied by the control apparatus) the respective values for the variables that are currently held stored in the aforementioned data register means of the A/D conversion processing apparatus. When that is done, the control apparatus compares these values for the variables with the corresponding values that were originally transmitted from the control apparatus (more specifically, the most recently transmitted values for the variables). The control apparatus can thereby determine whether the values for the variables that are held in the A/D conversion processing apparatus have become altered, e.g., due to the effects of electrical noise.

The control apparatus is configured such as to delete the set of final values most recently obtained from the A/D conversion processing apparatus, when it is judged that any of a received set of values for the variables does not match the corresponding originally transmitted value. It can thereby be ensured that any erroneous final values that have been derived based upon incorrect values for one or more of the variables will not have an effect upon the control operation performed by the control apparatus.

From another aspect, in the case of an A/D conversion processing apparatus as described hereinabove which has a first set of input terminals whereby each input analog signal applied thereto is transferred via a filter circuit to the A/D conversion means, and a second set of input terminals whereby each input analog signal that is applied thereto is directly supplied to the A/D conversion means, with digital noise exclusion processing (e.g., selection of respective median values from successive set of m A/D converted values) being applied only to the A/D converted values derived for each analog signal that is applied to one of the second set of input terminals, such an A/D conversion processing apparatus can be advantageously applied to a type of analog signal that consists of background level intervals and abrupt variation intervals, i.e., an analog signal that varies only gradually within the background level intervals and has sudden changes in amplitude during the abrupt variation intervals. An example of such a signal is the air/fuel ratio sensor signal of a vehicle engine.

Specifically, such an analog signal to the A/D can be coupled via a filter circuit to one of the first set of input terminals and also be directly connected to one of the second set of input terminals. The A/D conversion processing apparatus operates such that during each background level interval, A/D conversion is applied to the analog signal transferred through the second set of input terminals, so that the resultant A/D converted values are subjected to digital noise exclusion processing (i.e., using the converted data memory means, data detection means, the data processing means and final result memory means as described above) to obtain and store successive final values representing the analog signal during the background level intervals. During each abrupt variation interval, the analog signal transferred via the first set of input terminals (i.e., which has been passed through an analog filter circuit) is subjected to A/D conversion, and the resultant digital values are directly stored as final values, without being subjected to digital noise reduction processing (or at least, are not subjected to processing to select median values).

In that way, such an analog signal can be processed through two different A/D conversion channels, such as to make it possible to achieve optimum noise reduction processing for both the abrupt variation intervals and the background level intervals of the signal.

BRIEF DESCRIPTION OF THE DRAWINGS

FIGS. 6A to 6C are timing diagrams illustrating timing relationships of data communication executed between a microcomputer of the first embodiment and the input IC;

FIG. 8 is a diagram for use in describing a noise reduction effect achieved by digital processing executed by the input IC of the first embodiment;

FIG. 18A shows respective formats of requests for data that are transmitted from the microcomputer to the input IC of the fourth embodiment, and FIG. 18B shows the format in which sets of data and register values for respective channels are transmitted from the input IC to the microcomputer;

DESCRIPTION OF PREFERRED EMBODIMENTS

Embodiments of an electronic control apparatus will be described in the following, each being an engine ECU (electronic control unit) of a motor vehicle.

First Embodiment

Figure 1:
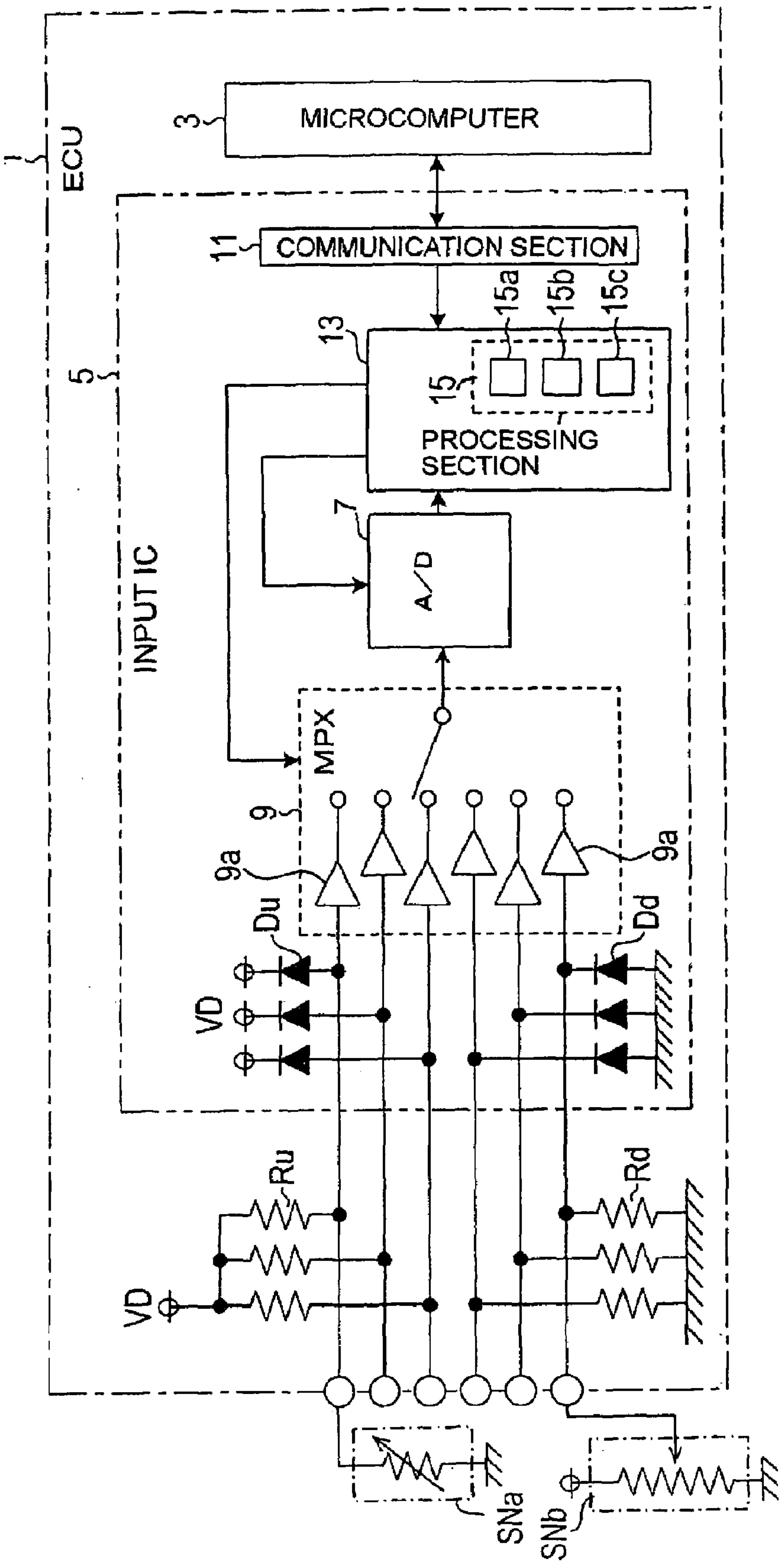
FIG. 1 is a system block diagram of a first embodiment of an ECU.

FIG. 1 is a system block diagram of a first embodiment, in which an ECU 1 is made up of a microcomputer 3 that controls a vehicle engine and an input IC 5 for performing A/D conversion of a plurality of input analog signals (in this embodiment, 6 signals). These analog signals are produced by respective sensors which detect various operating parameters of the engine. Digital signals respectively corresponding to the input analog signals are supplied from the input IC 5 to the microcomputer 3, e.g., multiplexed as successive sets of digital values, for use in performing the control operations.

The input IC 5 includes an A/D converter 7, a multiplexer 9 which cyclically selects the input analog signals, to supply these to the A/D converter 7, a communication section 11 for performing serial data communication with the microcomputer 3, and a processing section 13 which controls the multiplexer 9 and the A/D converter 7 and processes the A/D converted values that are produced from the A/D converter 7 to effect noise elimination as described hereinafter, with resultant digital values being supplied to the communication section 11 to be transferred to the microcomputer 3.

The processing section 13 includes a RAM (random access memory) 15, having three memory regions that are respectively designated as the converted data memory region 15*a*, the sorting processing-use memory region 15*b* and the final result memory region 15*c*. The converted data memory region 15*a* is formed of six memory regions, respectively reserved for A/D converted values of the six input analog signals. Each of these six regions within the converted data memory region 15*a* serves to store a plurality of digitized values, which are the most recently obtained set of A/D converted values that have been derived by the A/D converter 7 (i.e., extending up to the currently derived value) by operating on the corresponding one of the six input analog signals. In the following description, it will be assumed that each of these sets consists of three successively derived A/D converted values of an input analog signal, extending up to the most recently derived value.

The sorting processing-use memory region 15*b* is utilized in sorting processing that is applied to each of the sets of A/D converted values held in the converted data memory region 15*a*, to arrange each set in order of magnitude of its values so that a median value of that set can be selected. The final result memory region 15*c* serves to temporarily store each of the most recently derived final values (i.e., respectively corresponding to the six input analog signals) that have been obtained by processing the median values, before the final values are transferred to the microcomputer 3.

The sensors which produce the input analog signals may include for example an air intake rate sensor, a throttle opening sensor, an engine coolant temperature sensor, etc. Such sensors can be broadly divided into two basic types, i.e., (a) two-terminal sensors, having one terminal connected to ground potential (i.e., 0 V, with respect to the power supply voltage of the input IC 5) and the other connected to the ECU 1, which vary in resistance in accordance with changes in the physical quantity that is being sensed, with these being referred to in the following as SNa sensors, and (b) three-terminal sensors, which produce an output voltage that varies in accordance with changes in the physical quantity that is being sensed, with these being referred to in the following as SNb sensors.

As shown in FIG. 1, the terminal of each SNa sensor that is connected to the ECU 1 is thereby connected internally via a corresponding signal line to a corresponding input buffer of the multiplexer 9, and also via a corresponding resistor Ru to the positive supply voltage VD of the ECU 1, to be thereby "pulled up" towards that potential to an extent determined by the resistance value of the sensor. In addition, each signal line of a SNa type sensor is connected to the anode of a corresponding surge protection diode Du, whose cathode is connected to the power supply voltage VD. An analog signal is thereby produced on the signal line of a SNa sensor, whose voltage level varies in accordance with the resistance value of the sensor, i.e., being produced by voltage division of the power supply voltage VD in a voltage divider formed of the sensor resistance and a resistor Ru.

VD is also supplied as the power supply voltage of the microcomputer 3 and the input IC 5, to operate the A/D converter 7, the multiplexer 9, the communication section 11 and the processing section 13.

In the case of each SNb sensor, the output terminal of the sensor is connected to a corresponding signal line within the ECU 1 as shown, which is connected to a corresponding input buffer 9*a* of the multiplexer 9, and is also connected via a resistor Rd to ground potential and connected to the cathode of a surge protection diode Dd within the input IC 5, with the diode anode being connected to ground potential. The resistor Rd serves to ensure that the input of the corresponding buffer 9*a* will be fixed at ground potential in the event that an open circuit occurs in the connecting lead between a SNb sensor and the ECU 1. The value of each resistor Rd is preferably selected to be substantially high, e.g., several hundred KΩ, so as not to have an effect upon normal operation.

Although not shown in the drawing, the microcomputer 3 also receives various digital signals such as output signals from a crank angle sensor, an engine speed sensor, etc., and applies various processing to these signals in conjunction with processing of the A/D converted signals supplied from the input IC 5, with the results of such processing being used to control the vehicle engine operation, e.g., fuel injection amounts, ignition timings, etc.

The ECU 1 of this embodiment does not include any filter circuits (e.g., CR circuits) coupled to the input analog signals of the input IC 5 for noise removal, with only digital removal of noise being performed upon the A/D converted signals as described hereinafter.

Figures 2A, 2B, 2C, 2D:
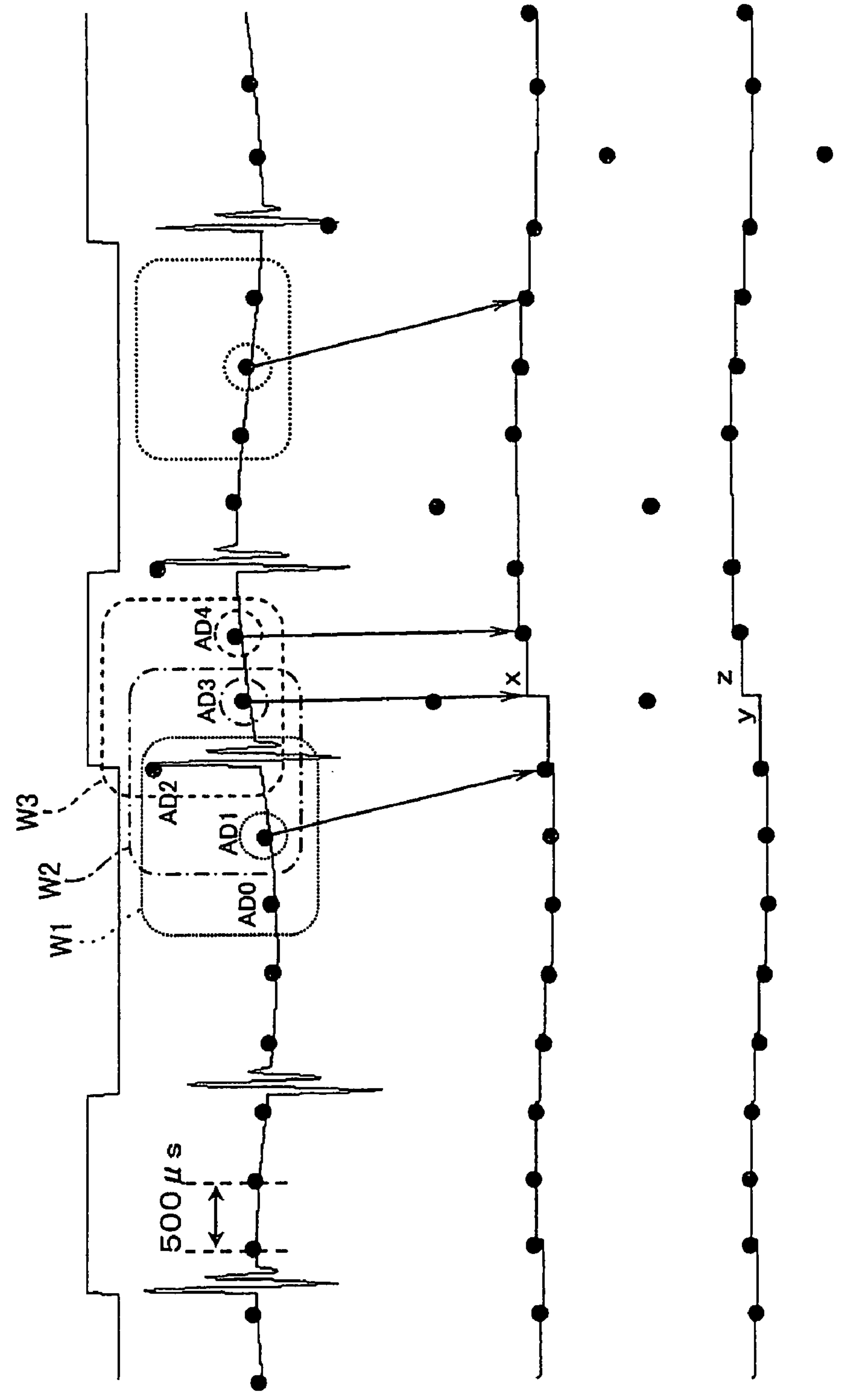
FIGS. 2A to 2D are timing diagrams for use in describing the operation of an input IC of the first embodiment.

The operation of the input IC 5 will be described in the following. The multiplexer 9 periodically selects successive ones of the input analog signals to be subjected to A/D conversion by the A/D converter 7, in a predetermined sequence. For simplicity of description, only the operations performed on one of these input analog signals will be described. FIG. 2A shows the waveform of switching that as periodically performed by a noise source, such as the ignition system, whereby bursts of electrical noise are periodically generated. FIGS. 2A to 2D are timing diagrams which conceptually illustrate the operations performed on an input analog signal by the input IC 5. The circular black dots in FIGS. 2B to 2D represent respective A/D converted values of an input analog signal that is shown in FIG. 2B.

Each time a new A/D converted value is derived, then the median value of that value and the two immediately precedingly derived A/D converted values (i.e., the one of these three digital values that is centrally located, when the three are arranged in order of magnitude) is detected by the processing section 13 of the input IC 5. The successive median values that are thereby obtained are shown in FIG. 2C.

As each new median value is derived, it is used in a digital smoothing calculation referred to in the following as factor-based averaging processing, with the digital value that is thereby obtained being stored as a final result in the region of the final result memory region 15*c* corresponding to the input analog signal, in the RAM 15.

In the example of FIGS. 2A to 2D, the dotted-line frame W1 in FIG. 2B encloses three successive A/D converted values AD0, AD1 and AD2 from which a median value is detected when AD2 is derived, i.e., with the median value in this case being AD1, so that there is the relationship AD0<AD1<AD2.

Similarly, the frame W2 encloses three values having the relationship AD1<AD3<AD2, so that when AD2 is derived, AD3 is detected as the median value, indicated as the value x in FIG. 2C. Also, the frame W3 encloses three values having the relationship AD3<AD4<AD2, so that when AD4 is derived, it is detected as the median value. In that way, the successive median values vary as shown in FIG. 2C. As can be seen, the series of median values express successive values of the input analog signal, with the effects of abnormal A/D converted values resulting from noise having been substantially eliminated.

The factor-based averaging processing is performed as follows. In general, designating a currently derived median value as $V_m$, the most recent value obtained by factor-based averaging processing as $V_{n-1}$ (i.e., which utilized the immediately precedingly derived median value), and N as a factor that is a fixed plural integer, $V_m$ is used to obtain a new value $V_n$ by factor-based averaging processing as:

$$V_n=((N-1).V_{n-1}+V_m)/N \qquad (1)$$

Such processing will be referred to as 1/N factor-based averaging.

It will be assumed that with this embodiment, the value of N is 2, (i.e., ½ factor-based averaging) so that:

$$V_n=V_{n-1}+V_m/2 \quad (2)$$

In the following, a value $V_n$ that is obtained by the above factor-based averaging processing will be referred to simply as a factor-averaged value. FIG. 2D shows the successive factor-averaged values that are derived from the median values of FIG. 2C, with for example the factor-averaged value z being derived based on the median value x and the immediately precedingly derived factor-averaged value y. As a result of the factor-based averaging processing, the effects of noise on the A/D converted values is further reduced, so that the series of final values shown in FIG. 2D accurately represent the input analog signal.

Figures 3A, 3B, 3C, 3D:
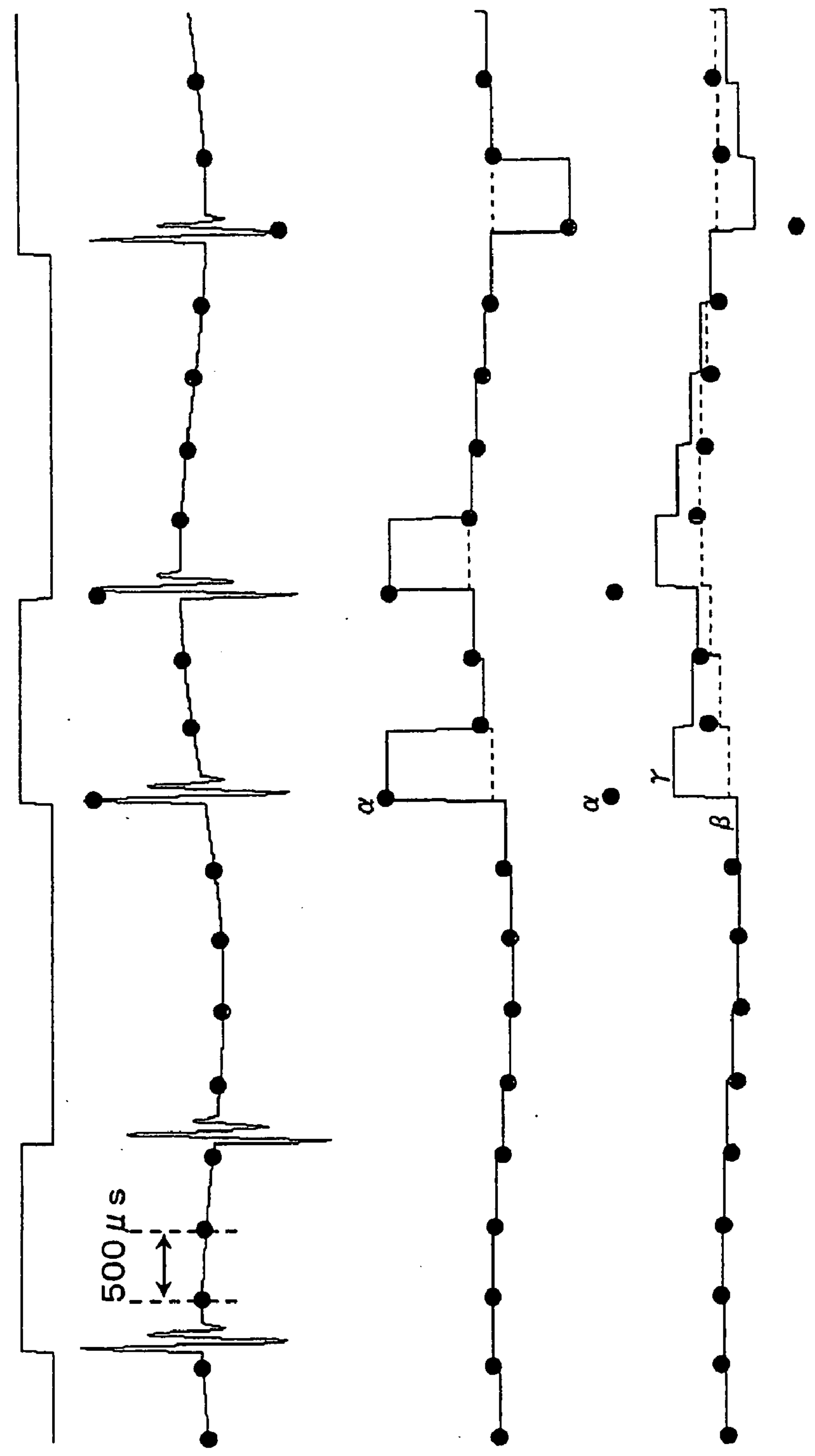
FIGS. 3A to 3D are timing diagrams for use in describing effects of factor-based averaging processing applied to digital values derived from A/D conversion operations of the first embodiment.

The effects of factor-based averaging processing are made clearly apparent from the diagrams of FIGS. 3A to 3D, in which FIGS. 3A, 3B correspond to FIGS. 2A, 2B above. FIG. 3C shows the effects of noise peaks in the input analog signal, caused by the ignition system, upon the A/D converted values. FIG. 3D shows the resultant final values that would be obtained if factor-based averaging processing (using a factor N of 2 as in the above example) were to be applied directly to the A/D converted values, instead of applying that processing to the median values as is done with the first embodiment as described above. The broken-line portions in FIGS. 3C, 3D illustrate how the respective values would vary if there were no noise present in the input analog signal. As can be seen, some removal of the effects of noise from the final values is achieved, but these still deviate significantly from the original input analog signal.

However as shown in FIG. 2D above, a much greater noise removal effect is attained by first deriving the median values, before applying the factor-based averaging processing.

In the above it is assumed that each median value is obtained from three successive A/D converted values. However it would be equally possible to derive each median value from each set of five successive A/D converted values, or from every seven A/D converted values. The greater the number of A/D converted values from which each median value is selected, the more effective will be the noise elimination effect, and this is also true if the value of N in equation (1) above is increased beyond 2. Such increases have an effect that is analogous to increasing the time constant of a low-pass analog filter.

Figure 4:
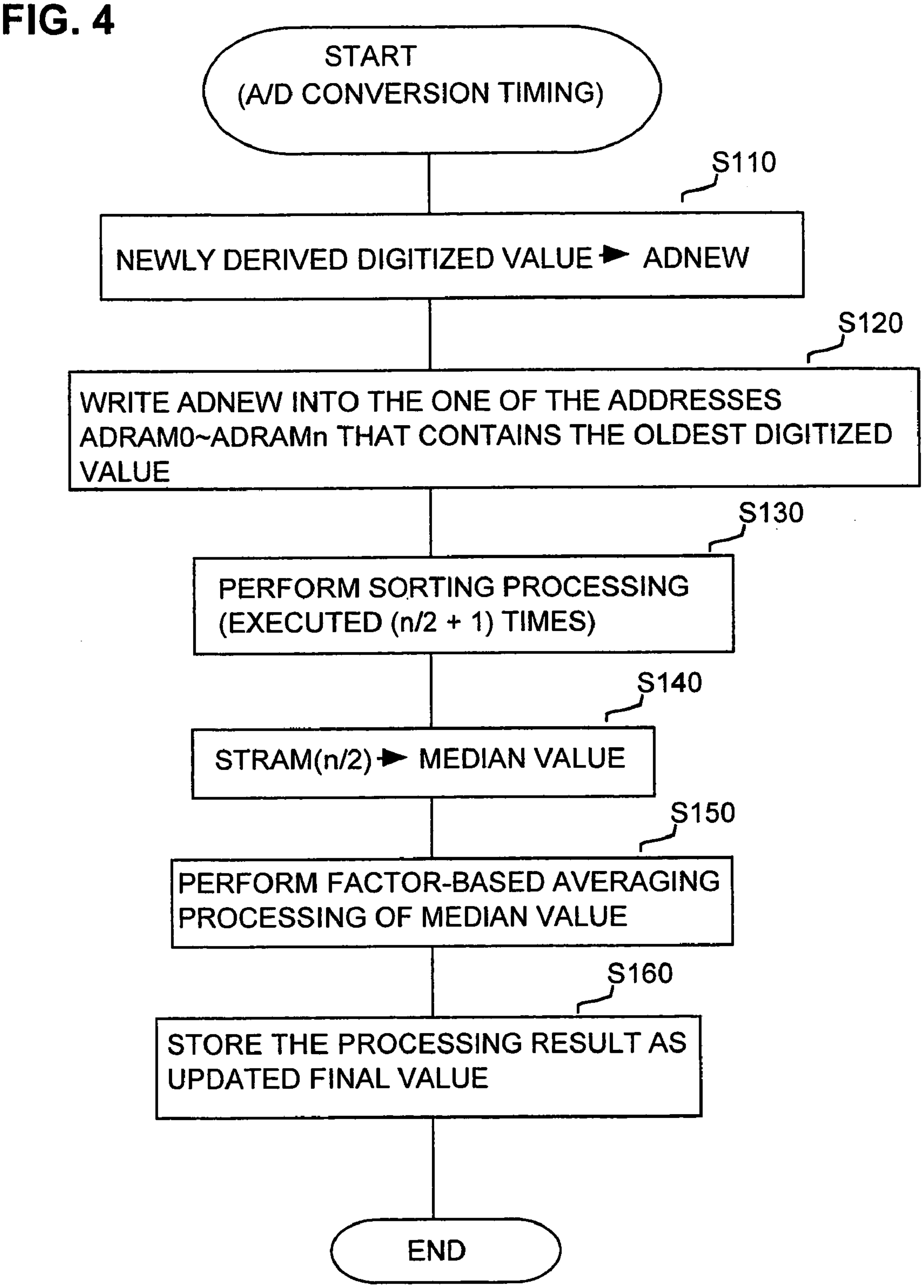
FIG. 4 is a flow diagram of a processing sequence that is executed by the input IC of the first embodiment on an input analog signal at each of successive A/D conversion timings.

The operation of the input IC 5 will be described in more detail, referring to FIG. 4 and FIGS. 5A, 5*b*, 5C. The processing section 13 of the input IC 5 periodically controls the multiplexer 9 to successively transfer the input analog signals to the A/D converter 7 in a predetermined sequence, whereby a set of six successive A/D converted values are derived from the respective analog signals. The following describes the processing of one of the input analog signals. FIG. 4 is a flow diagram of an operation sequence performed by the processing section 13 each time an A/D conversion of this analog signal is completed by the A/D converter 7. Firstly, the newly derived A/D converted value is stored, with the identifier ADNEW, in step S110. The converted data memory region 15*a* has respective sets of (n+1) addresses where n is an even-numbered integer of 2 or more, with these sets respectively corresponding to the input analog signals (i.e., each being reserved for A/D converted values of a specific input analog signal). The set corresponding to the analog signal under consideration will be designated as ADRAM0 to ADRAMn.

(n+1) is equal to the number of successive values from which each median value is selected, as described hereinabove.

In step S120, ADNEW is stored in the one of the addresses ADRAM0 to ADRAMn that contains the oldest value (i.e., to replace that oldest value). The sorting processing-use memory region 15*b* has six sets of (n+1) addresses, with these sets respectively corresponding to the six input analog signals. The set corresponding to the analog signal under consideration will be designated as STRAM0 to STRAMn.

In step S130, the values held in the addresses ADRAM0 to ADRAMn of the converted data memory region 15*a* are copied into the addresses STRAM0 to STRAMn respectively of the sorting processing-use memory region 15*b*, and a plurality of sorting processing operations are then performed to arrange the values held in addresses STRAM0 to STRAMn respectively in order of successively increasing magnitude, so that the median value becomes stored in the address STRAM(n/2). A total of (n/2+1) sorting processing operations are successively performed to achieve this.

Next, in step S140 the value held in STRAM(n/2) is read out, as the currently derived median value, and in step S150 the factor-based averaging processing is applied to that value. In step S160, the value obtained from the factor-based averaging processing is stored in the final result memory region 15*c*, as a final value, to be used by the microcomputer 3 in engine control. The processing of FIG. 4 then ends.

Figure 5A:
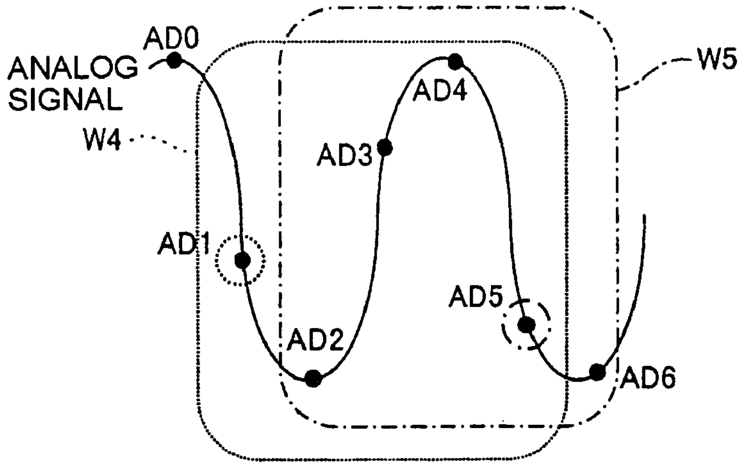
FIGS. 5A to 5C are diagrams for use in describing the effects of the processing shown in FIG. 4.
Figure 5B:
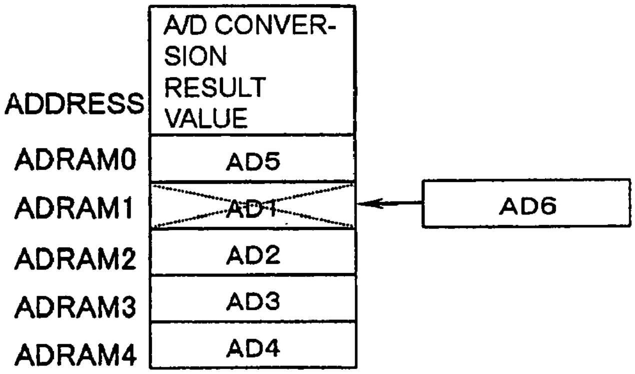
Figure 5C:
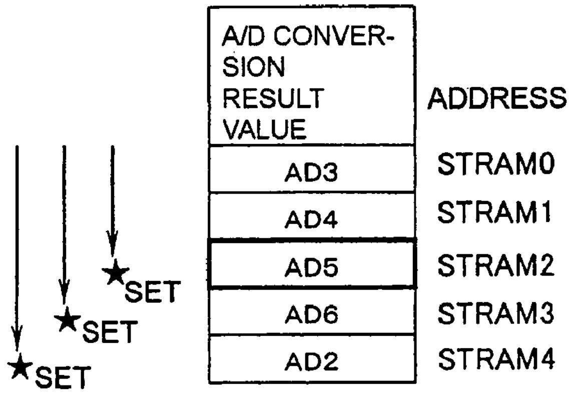

It will be assumed that n is equal to 4, i.e., that the five most recently derived A/D converted values are stored in the converted data memory region 15*a* and the median value of these five values is derived. In that case, as illustrated in the example of FIG. 5A, in which six successive A/D converted values AD1 to AD6 have the relationship AD4>AD3>AD1>AD5>AD6>AD2 the value AD1 will be selected as the median value of the five values AD1 to AD5 shown within the dotted-line frame W4, while the next median value will be selected as AD5, from the values AD2 to AD6 shown within the chain-line frame W5. Specifically, in step S120 of FIG. 4, if AD6 is the currently derived A/D converted value, it is stored in address AD1 of the converted data memory region 15*a* in place of the oldest stored value, i.e., AD1, as illustrated in FIG. 5B. Hence, in step S130 of FIG. 4, the values AD5, AD6, AD2, AD3, AD4 will be copied into successive addresses of the sorting processing-use memory region 15*b*, starting from STRAM0. Sorting processing will then be performed repetitively, to leave the values AD5, AD2, AD6 stored in successively numbered addresses STRAM2~STRAM4 of the sorting processing-use memory region 15*b*, arranged in order of their respective magnitudes. This resultant condition of the sorting processing-use memory region 15*b* is illustrated in FIG. 5C.

Specifically, in the first of three stages of the sorting processing, all possible pairings of the values AD2~AD5 are examined, to find the smallest of these, leaving AD5, AD6, AD3, AD4, AD2 respectively stored in the addresses STRAM0~STRAM4. In a second stage, the remaining values AD3, AD4, AD5, AD6 are similarly examined, to find the second-smallest of the values AD2~AD5. This leaves the values AD5, AD3, AD4, AD6, AD2 respectively stored in the addresses STRAM0~STRAM4, i.e., with the second-smallest value being AD6. In the third stage, the third-smallest of the values AD2~AD5 (i.e. the median value of these) is similarly determined. Execution of the third sorting stage leaves the values AD3, AD4, AD5, AD6, AD2 respectively stored in the addresses STRAM0~STRAM4 as shown in FIG. 5C, with the median value (AD5) stored in address STRAM2.

It can thus be understood that with this example, in which n=4, a total of 9 sorting operations, i.e., (4+3+2) are required to find a median value. If the value of n were 6, then a total of 18 (6+5+4+3) sorting operations would be required.

In step S140 of FIG. 4, the value AD5 that is left stored in the center address STRAM2 of the sorting processing-use memory region 15*b* is read out, as the median value corresponding to the currently derived A/D converted value of the analog signal under consideration, and is then operated on in step S150 to obtain an updated (final) value, which is stored in the final result memory region 15*c*.

In FIGS. 6A, 6B, 6C, the timing diagram of FIG. 6A illustrates how the microcomputer 3 communicates with the input IC 5 at periodic intervals (in this example, once every 4 ms), to send data requests to the input IC 5, and receive data transmitted from the input IC 5. As before, only the operation with respect to a single input analog signal will be described. FIG. 6B conceptually illustrates the derivation of successive A/D converted values (indicated as respective-black dots) for the analog signal, with this assumed to occur at 250 μs intervals as shown, while FIG. 6C illustrates how updated final values are successively written into the region of the final result memory region 15*c* corresponding to that analog signal.

In this case, the input IC 5, the A/D converter 7, multiplexer 9 and processing section 13 each operate independently of the timings at which communication with the microcomputer 3 are performed. When a data request is received by the processing section 13 from the microcomputer 3 via the communication section 11, the processing section 13 responds by transmitting to the microcomputer 3 (via the communication section 11) the most recent final values that have been derived for each of the input analog signals and stored in the final result memory region 15*c* as described hereinabove.

In that way, up-to-date digital data accurately representing the input analog signals supplied to the input IC 5 are transmitted to the microcomputer 3 as control input data for use in engine control, with the effects of noise in the input analog signals having been substantially eliminated so that such noise (i.e., appearing as digital values that are of much greater magnitude than adjacent values) will not affect the engine control operation, and that this is achieved without applying filtering to the analog signals.

It should be noted that with the above embodiment, noise elimination is achieved without requiring to perform any special type of judgement to distinguish between noise and a valid signal. That is to say, judgment is performed to find the median value of a most recently derived set of A/D converted values, so that the results are not affected by the particular characteristics of the noise.

Figure 7A:
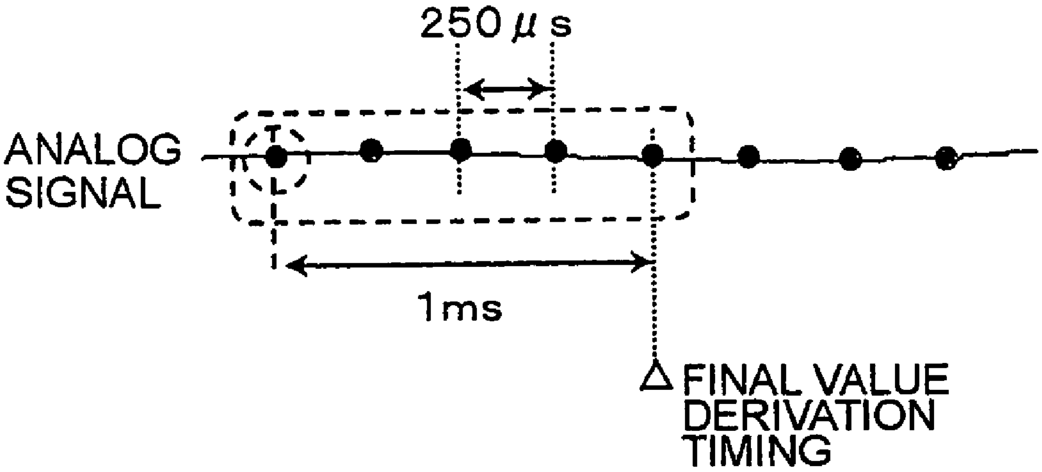
FIGS. 7A, 7B are timing diagrams for use in describing effects of delays caused by processing operations of the input IC of the first embodiment.

The effects of delays upon the operation of the above embodiment will be discussed in the following. It will be assumed that the input IC 5 performs A/D conversion of the input analog signals once every 250 μs, and that n is equal to 4, i.e., that each median value is detected from the most recently obtained five successive A/D converted values of an input analog signal. In that case, as illustrated in the diagram of FIG. 7A, if the input analog signal exhibits only small amounts of variation, then a maximum delay of 1 ms (250 μs×4) will occur. That is to say, there will be a maximum of 1 ms between the timing of deriving a median value and the preceding timing at which the corresponding the A/D converted value was obtained. When there are only small amounts of variation in the input analog signal, such a delay will have no significant effect upon engine control performed by the microcomputer 3.

Figure 7B:
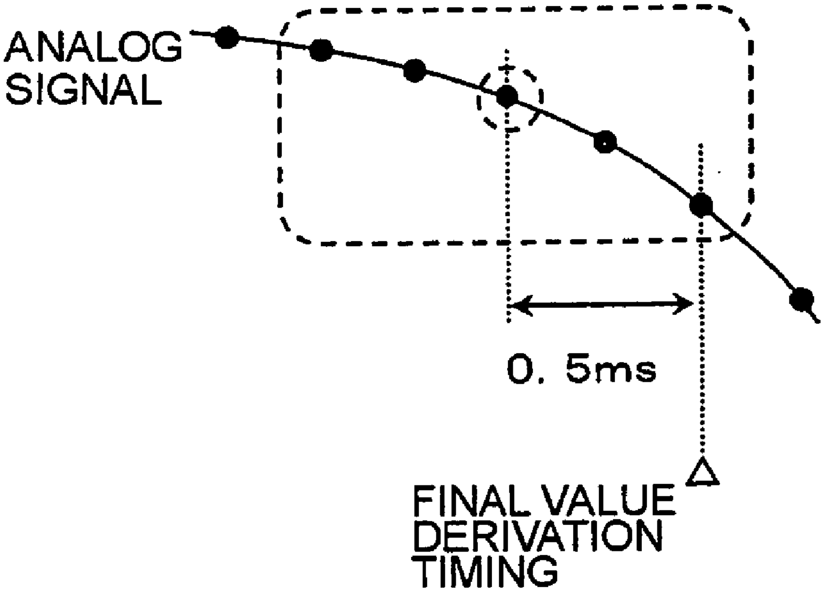

Next, as shown in FIG. 7B, if the input analog signal varies substantially during an interval in which five successive A/D converted values are derived, then it is basically probable that the median one of these five values will be detected as the third (along the time axis). In that case, the delay would be 0.5 ms, i.e., the detected median value is an A/D converted value that was derived 0.5 ms previously. If that median value is then subjected to ¼ factor-based averaging (i.e., N=4), the delay caused by that processing (expressed as a time constant with respect to impulse response) will be approximately 0.7 ms. Hence, the total delay will be approximately 1.2 ms.

In the case of a prior art system in which an analog filter (in general, an RC filter) is connected to each input analog signal line, the time constant τ of a filter will generally be set as approximately 1 ms (for example, using an RC filter formed of a 1 μF capacitor and 10 KΩ resistor). Taking into account the temperature characteristics of the capacitor and the resistor and the effects of manufacturing tolerances upon the values of the capacitor and resistor, the delay will actually be approximately 1±0.3 ms.

Hence, the delay of approximately 1.2 ms that could be expected with the first embodiment is of the same order as that of a conventional analog filter circuit. Even if the input signal varies substantially, as in the example of FIG. 7B, the delay will not generally be significant. Moreover if, as shown in FIG. 6, updated sets of final data derived by the input IC 5 are transmitted to the microcomputer 3 once every 4 ms, it can be understood that a delay of approximately 1 ms presents no problem.

FIG. 8 illustrates a case in which an input analog signal exhibits sudden large-scale changes in amplitude. In this example, the value AD1 is selected as the median value of the A/D converted values AD1 to AD5 shown within frame W6, while the value AD5 is selected as the median value of the A/D converted values AD2 to AD6 shown within frame W7, and the value AD5 is selected as the median value of the A/D converted values AD3 to AD7 shown within frame W8. As can thus be understood, in such a case, the median values are selected as values that are close to the center of the range of amplitude variation of the input analog signal. Hence, a substantial smoothing (filtering) effect is achieved.

As mentioned hereinabove, a similar effect to increasing the time constant of an analog low-pass filter circuit can be achieved by increasing the number of successive A/D converted values from which each median value is detected (i.e., 3, 5, 7, etc.). Such "time constant" changes can also be achieved by altering the interval between successive A/D conversions, or the factor N of the factor-based averaging.

Second Embodiment

A second embodiment of an ECU will be described in the following. Since the hardware configuration of this embodiment can be identical to that of the first embodiment, only points of difference between the ECUs of the first and second embodiments will be described in detail, and components of the second embodiment having functions corresponding to those of the first embodiment will be designated by corresponding reference numerals to those of the first embodiment. The above is also true of other embodiments described hereinafter, unless otherwise indicated.

It will further be assumed that with the second embodiment, the interval between successive A/D conversions of an input analog signal is 250 $\mu$s and the value of n is 4. In the same way as for the first embodiment, only the processing applied to a single input analog signal will be described, unless otherwise indicated.

Figures 9A, 9B, 9C:
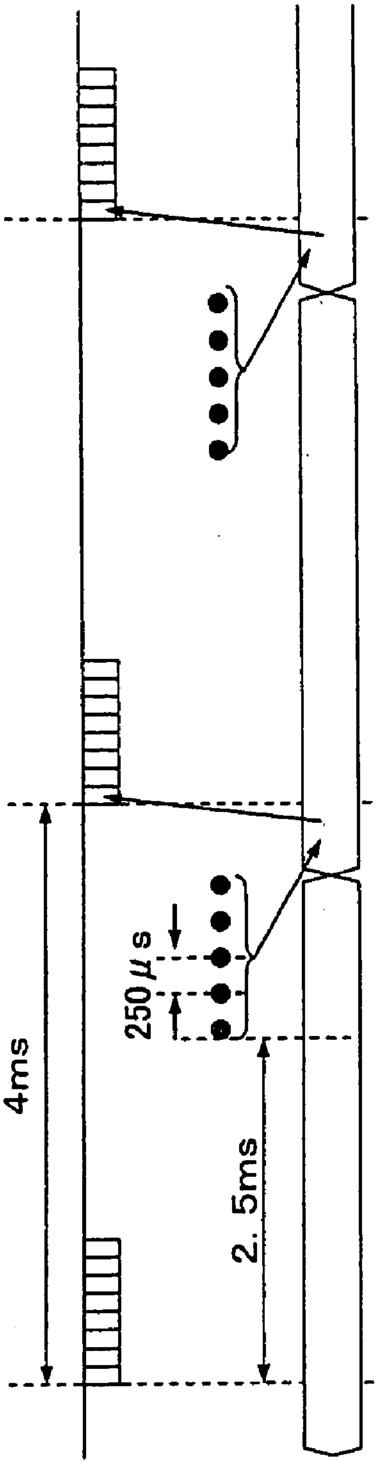
FIGS. 9A to 9C are timing diagrams illustrating timing relationships of data communication executed between a microcomputer and an input IC of a second embodiment.

FIGS. 9A, 9B, 9C are a timing diagrams for use in describing the operation of the second embodiment with respect to transfer of data from the input IC 5 to the microcomputer 3. As in the case of FIGS. 6A to 6C, the operation will be described for the case of a single input analog signal, with the circular black dots representing respective A/D conversions of that signal.

FIG. 9A illustrates how data communication is performed between the microcomputer 3 and input IC 5 at fixed intervals, assumed here to be 4 ms, while the as illustrated in FIG. 9B, the A/D converter 7, multiplexer 9 and processing section 13 begin operations for deriving a new median value at a time point that occurs 2.5 ms after the start of the most recent interval of data communication with the microcomputer 3, i.e., that occurs 1.5 ms before the start of the succeeding interval of data communication with the microcomputer 3. Thus, the input IC 5 begins to perform a series of five successive A/D conversion operations on the input analog signal, with a period of 250 $\mu$s, 1.5 ms before the start of the next data communication interval. Referring to the operations of steps S110, S120 in FIG. 4 described above, at the time point when the most recently derived 5 A/D converted values have been set into the converted data memory region 15*a* as a result of steps S110, S120, the median value of these five values is detected (steps S130, S140) and the factor-based averaging is then applied to that median value, with the result being stored as an updated final value in the final result memory region 15*c*.

At the start of each interval of data communication with the microcomputer 3, the processing section 13 of the input IC 5 transmits each of the most recently derived final values obtained for each of the input analog signals, held in the final result memory region 15*c* at that time, to the microcomputer 3 via the communication section 11. It can be understood that with the example of FIGS. 9A to 9C, the most recent updated final value has become stored in the final result memory region 15*c* at a point that occurs 0.5 ms prior to the start of the next interval of data communication with the microcomputer 3.

It can thus be understood that whereas with the first embodiment (for each of the input analog signals) a plurality of A/D conversions, with corresponding median value detection and factor-based averaging processing operations to obtain successive updated final values, are performed prior to each interval of data communication with the microcomputer 3, with the second embodiment only a single final value is derived prior to each interval of data communication with the microcomputer 3. However that final value is derived and stored in the final result memory region 15*c* at a time which occurs only 0.5 ms before the start of a communication operation whereby that final value is transferred to the microcomputer 3. Hence, each time the microcomputer 3 receives a digital value of an analog signal, there is a minimum delay between the time of receiving that digital value and the time at which that value actually represented the level of the corresponding analog signal.

Moreover this is achieved while reducing the number of A/D conversion operations, so that the power required to operate the input IC 5 can be reduced.

With the second embodiment as described above, the timings of A/D conversion operations are linked to the timings of intervals of communication between the microcomputer 3 and input IC 5. However as an alternative form of the second embodiment, it would be possible for the input IC 5 to independently determined the timings at which the A/D conversions are to be performed. As a further alternative, it could be arranged that the microcomputer 3 transmits commands to the input IC 5 for designating each time point at which a set of A/D conversions (for use in deriving an updated set of final values for the respective input analog signals) are to be started.

Third Embodiment

A third embodiment will be described in the following. In the same way as for the preceding embodiments, the description will be based on processing of a single input analog signal. The ECU 1 of this embodiment differs from that of the first embodiment in that the sorting processing-use memory region 15*b* of the RAM 15 is omitted. Furthermore, instead of the processing of FIG. 4 described above, the processing sequence shown in FIG. 10 is executed by the processing section 13 of the input IC 5 of the third embodiment each time an A/D conversion has been performed. However the processing of FIG. 10 does not begin to be executed until after a total of (n+1) A/D conversion operations of the corresponding analog signal have been completed following switch-on of power to operate the ECU 1 and the start of operation (where n is an even-numbered integer, of value 2 or greater).

Specifically, following the start of operation of the ECU 1, when a total of (n+1) digital values resulting from successive A/D conversions have become stored in the addresses ADRAM0~ADRAMn of the converted data memory region 15*a*, these values are then arranged in order of magnitude in respective ones of the addresses ADRAM0~ADRAMn, such that the largest value is held in ADRAM0. When that has first been completed, the processing sequence of FIG. 10 is then executed when the next A/D conversion has been performed.

Figure 10:
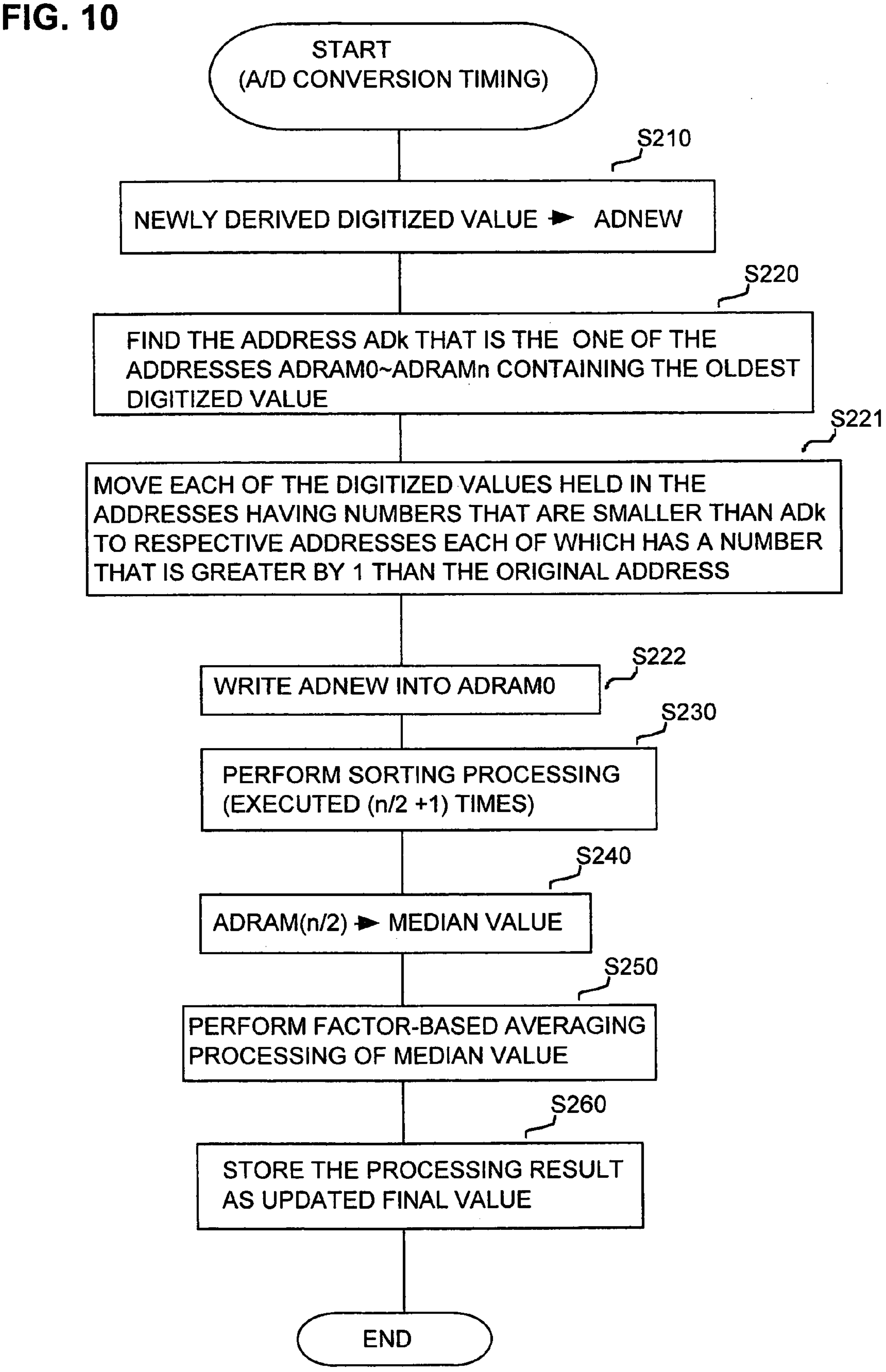
FIG. 10 is a flow diagram of a processing sequence that is executed by the input IC of a third embodiment at each of successive A/D conversion timings.

In a first step S210 of the processing of FIG. 10, the newly derived A/D converted value is temporarily stored, with the identifier ADNEW. Next in step S220, the oldest of the A/D converted values held in the addresses ADRAM0~ADRAMn of the converted data memory region 15*a* is determined, and then the respective A/D converted values held in addresses having an address number that is smaller than the address containing the oldest value are each moved to an address which is greater by one than the previous address. ADNEW is then written into the address having the smallest address number, i.e., ADRAM0.

Next, in step S230, the A/D converted values held in ADRAM0~ADRAMn are subjected to sorting processing to determine the smallest of these values, which is then written into the address ADRAMn. This is achieved by a single-stage sorting processing operation.

In the next step S240, the A/D converted value that is held in the median address of ADRAM0~ADRAMn, i.e., address ADRAM(n/2), is read out as the median value of the most recently derived (n+1) A/D converted values. In step S250, factor-based averaging processing is applied to that median value. In step S260, the value obtained from the factor-based averaging processing is stored in the final result memory region 15*c*, as a final value, to be used by the microcomputer 3 in engine control. The processing of FIG. 10 then ends.

Figure 11A:
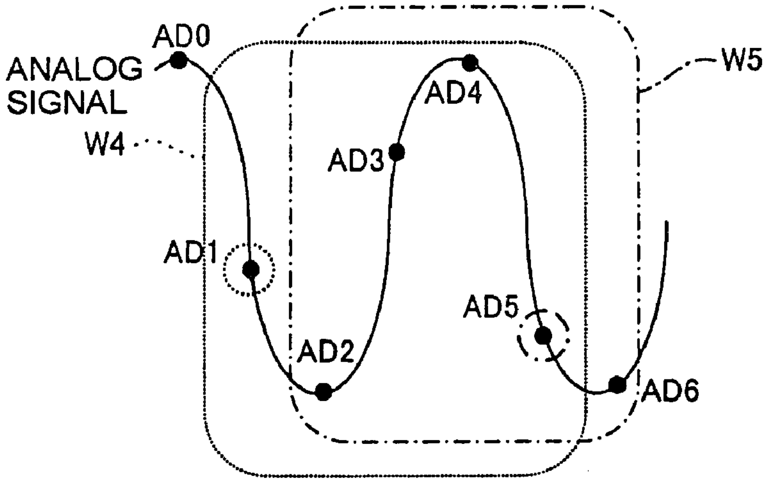
FIGS. 11A to 11C are diagrams for use in describing the effects of the processing shown in FIG. 10.
Figure 11B:
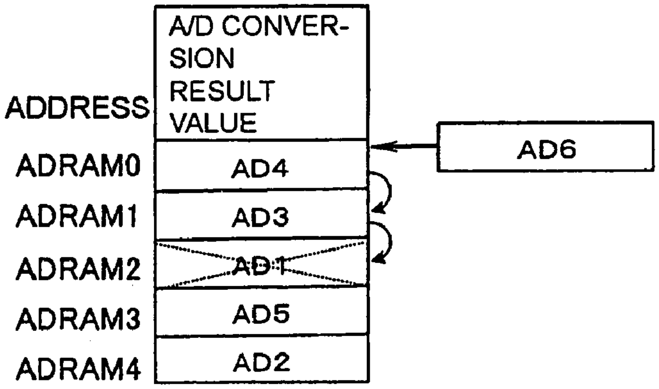

In the example of FIG. 11A, as in the example of FIG. 5A described above for the first embodiment, six successive A/D converted values AD1 to AD6 have the relationship AD4>AD3>AD1>AD5>AD6>AD2. After a set of five values AD1 to AD5 shown within the frame W9 in FIG. 11*a* have become stored in the converted data memory region 15*a*, then when the next A/D conversion operation is performed, with AD6 becoming the currently derived A/D converted value, the subsequent operation is as illustrated in FIG. 11B. Firstly, it is determined that the oldest value (i.e., AD1) is held in address ADRAM2 of the converted data memory region 15*a*. As a result, the respective values AD4, AD3 held in the addresses ADRAM0, ADRAM1 (having smaller address numbers than ADRAM2) are moved to addresses whose numbers are increased by 1 with respect to the original addresses, i.e., AD4, AD3 are moved to ADRAM1, ADRAM2 respectively.

In addition, the currently derived A/D converted value AD6 is written into ADRAM0, to overwrite the previous contents.

Figure 11C:
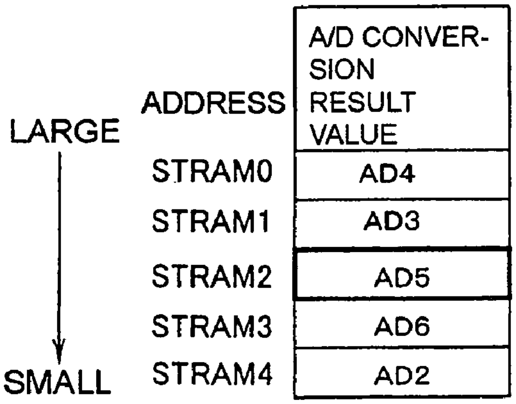

Furthermore with this example, in step S230 of FIG. 10, a single stage of sorting processing to arrange A/D converted values in order of increasing magnitude is performed on the values AD6, AD4, AD3, AD5, AD2 held in respective addresses extending from ADRAM0. As a result, the values AD4, AD3, AD5, AD6, AD2 are left respectively stored in the addresses ADRAM0~ADRAM4 respectively of the memory region 15*b*, as shown in FIG. 11C.

Next, in step S240 of FIG. 10, the value that has been stored in the address having the median address number (ADRAM2) is read out as the median value of AD2 to AD6. In that way, the median value AD5 is obtained. That value is then subjected to factor-based averaging in step S250, with the final value that is obtained thereby being stored in the final result memory region 15*c* as an updated value, in step S260.

It can thus be understood that with the third embodiment, it is necessary to perform processing in step S220 of FIG. 10 for determining the address numbers in which the A/D converted values are to be stored in the converted data memory region 15*a*. However the number of sorting operations that must be performed in step S230 (i.e., operations for comparing two values and then storing them in order of magnitude in successively numbered addresses) is reduced, by comparison with the previous embodiments.

For example if n=4, it is necessary to perform such sorting operations a maximum of 9 times to determine the median value, in step S130 of FIG. 4. However in the case of step S230 of FIG. 10, it is only necessary to perform such operations 4 times. In general, with the third embodiment, it is only necessary to perform a sorting operation (comparing two values and then storing them in order of magnitude) a total of n times.

In the case of an apparatus used in a motor vehicle, bursts or peaks of electrical noise may occur repetitively, with a regular period, at certain times. That is to say, if the engine speed remains stable for some time, then electrical noise that is generated by the ignition operations and fuel injection operations for the engine cylinders will occur with a regular period, which is determined by the engine speed. If an input analog signal is subjected to successive A/D conversion operations with a fixed repetition period, then it is possible that when the engine attains a certain speed, the timings of the A/D conversion operations will become synchronized with the noise occurrences.

A specific example will be described referring to the timing diagram of FIG. 12, for the case of an engine having 8 cylinders, operating at a speed of 10,000 rpm, with bursts of ignition noise being thereby repetitively generated with a period of 1500 μs. i.e.,:

$$(60\ \text{seconds}\times 1000\ \text{ms})/\{10{,}000\ \text{rpm}\times(360^\circ\ \text{CA}/90^\circ\ \text{CA}\}.$$

Figure 12:
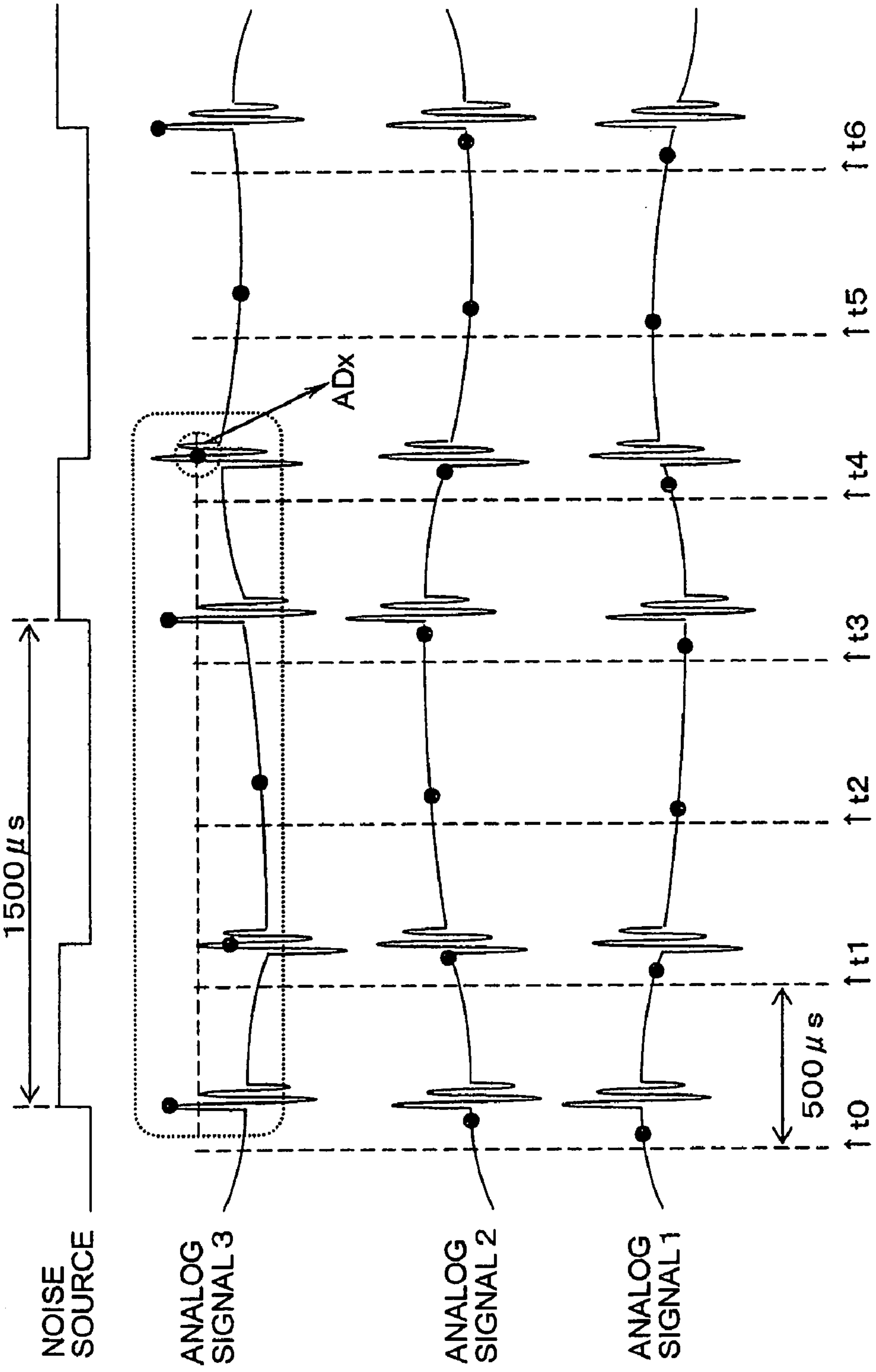
FIG. 12 shows timing diagrams for use in describing adverse effects which occur when periodically generated noise becomes synchronized with A/D conversion timings.

In such a case, when each of a plurality of input analog signals are each subjected to A/D conversion operations with a period of 500 μs between each conversion (the conversions being indicated by respective black dots in FIG. 12) and with the successive conversion operations for the respective input analog signals being performed in a fixed sequence as determined by the multiplexer 9 (e.g., the sequence: [analog signal 1, analog signal 2, analog signal 3] as in the example of FIG. 12), then the A/D conversion timings of one of these input analog signals (in FIG. 12, analog signal 3) may become synchronized with successive noise occurrences. Here, “noise occurrences” signifies short bursts or peaks of electrical noise, each having a duration that is shorter than the interval between successive A/D conversions of an analog signal.

When such synchronization occurs, one or more A/D converted values that have abnormal magnitudes due to the effects of noise, may become selected as median values, and so can result in abnormal final values being derived and supplied by the input IC 5 to the microcomputer 3, thereby affecting the engine control operation.

For that reason, each of the above embodiments is preferably configured such that A/D conversions of each input analog signal are performed without the repetition period of these conversions being fixed. The possibility that the final values produced by the input IC 5 will be affected by noise can thereby be made extremely small.

The present invention provides two alternative methods whereby this can be achieved, which can be applied to all of the embodiments of the invention described herein, and which will be referred to as noise countermeasure (a) and noise countermeasure (b), respectively, as follows:

Noise Countermeasure (a)

Figure 13:
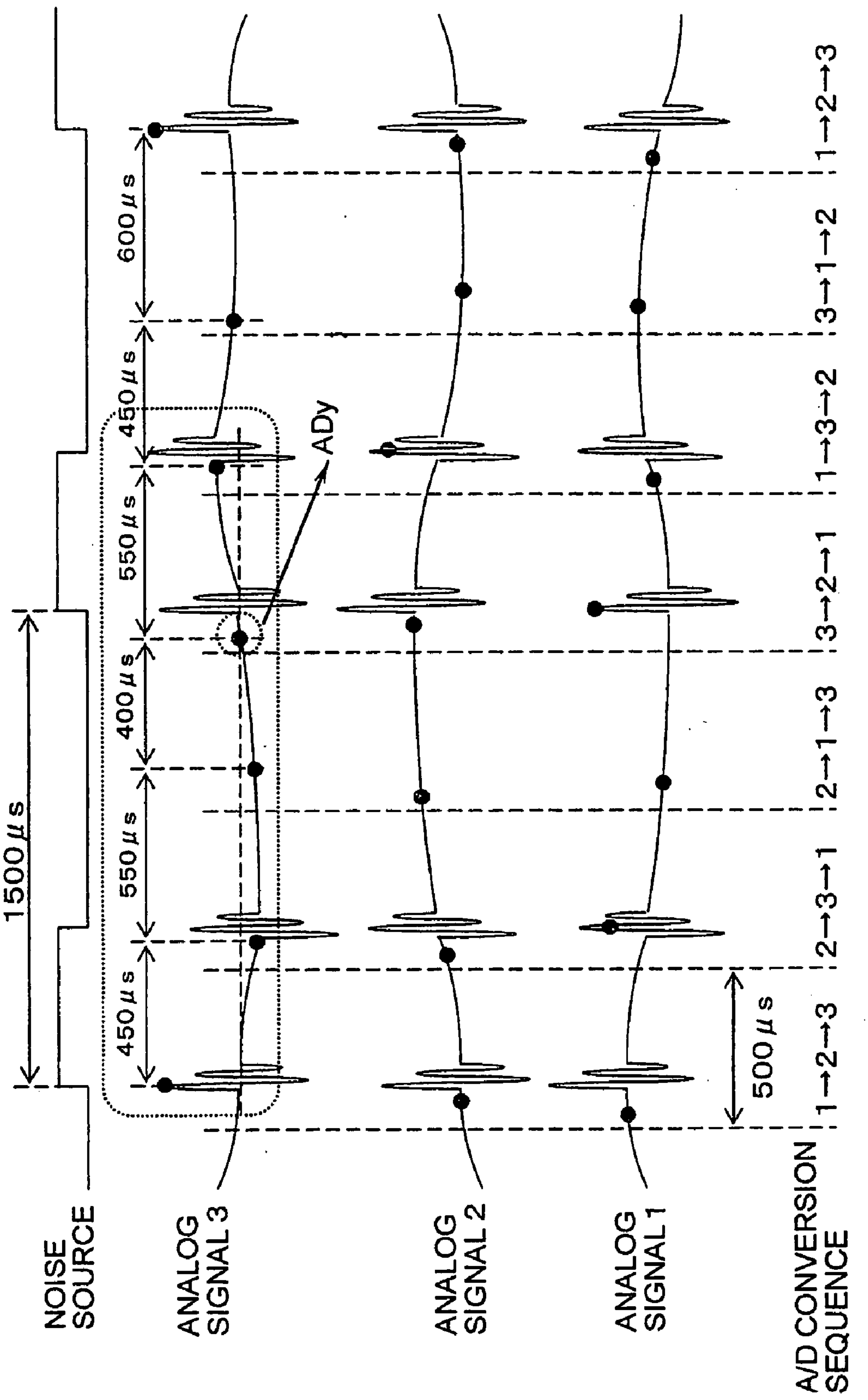
FIG. 13 shows timing diagrams for use in describing how the adverse effects shown in FIG. 12 can be overcome with the present invention.

In this case, as illustrated in FIG. 13, the timing at which A/D conversion of an input analog signal occurs following each of the time points t0, t1, t2, etc., is varied. However the variation is performed in a cyclically recurring sequence.

It is assumed that there are three input analog signals, so that there are six possible different sequences in which these can be successively inputted to the A/D converter 7 in each of the 500 us intervals between the time points t0, t1, t2, etc., with these sequences being indicated at the lower part of FIG. 13, respectively designated as “1→2→3”, etc. The cyclic repetition period of the sequence changes is (6×500 μs), i.e. 3 ms, as shown. Assuming that each A/D conversion requires 50 μs then for each of the input analog signals 1 to 3, the period between successive A/D conversions of that signal will vary between 450 μs, 550 μs, and 400 μs.

Figure 20:
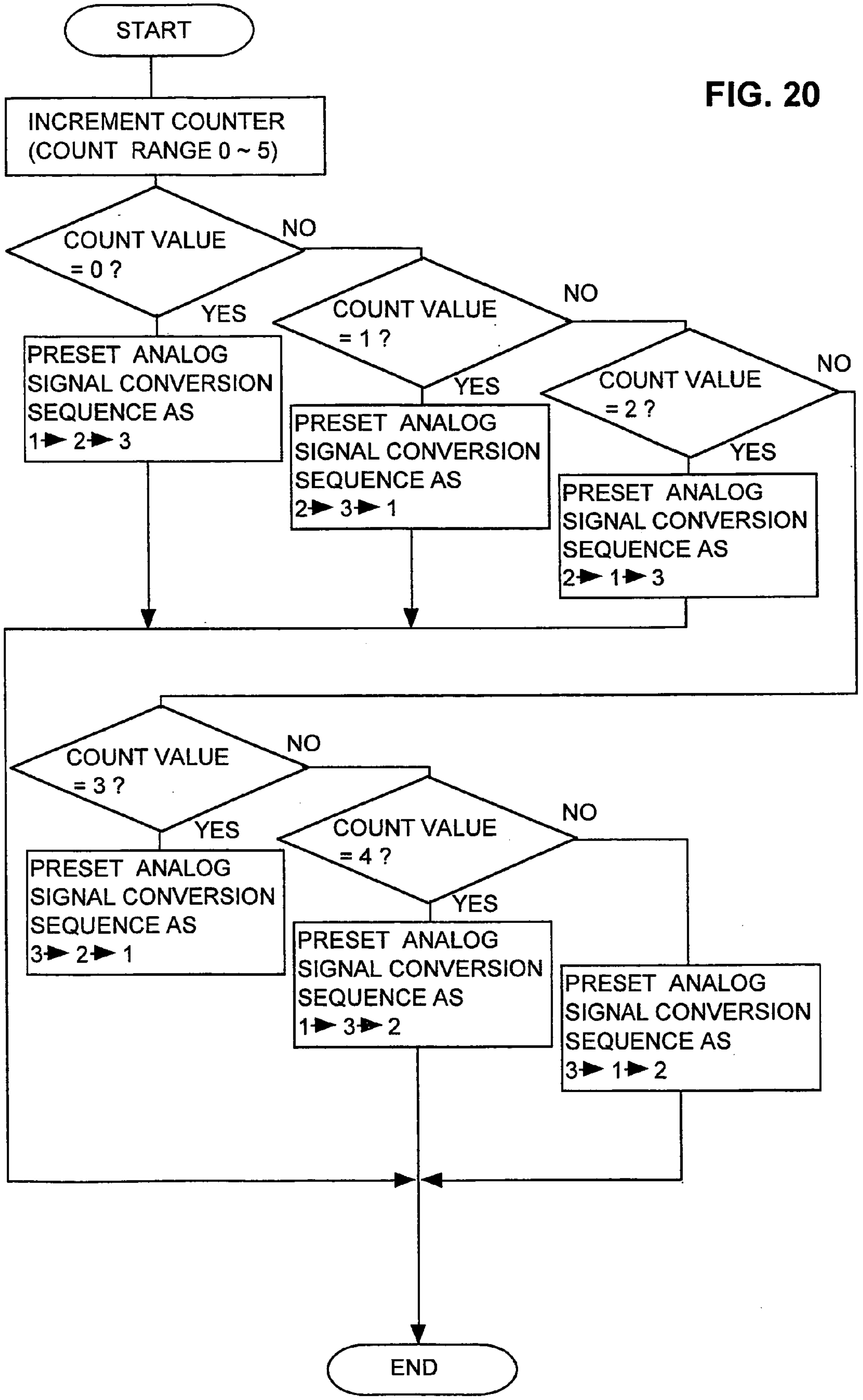
FIG. 20 is a flow diagram of processing executed to cyclically vary a sequence in which a plurality of analog signals are selected for A/D conversion by a multiplexer.

FIG. 20 is a flow diagram of processing that could be executed by the processing section 13, prior to each of time points t0, t1, t2, etc., to cyclically determine the next sequence in which the plurality of input analog signals will be respectively inputted to the A/D converter 7 by the multiplexer 9. As shown, a counter is utilized, having a maximum count value equal to the number of possible sequences of analog signal conversion timings, e.g., a counter which counts from 0 to 5 in the case of the example of FIG. 13. The counter is incremented by one, prior to each of the time points t0, t1, t2, etc., and the sequence in which the input analog signals which next be selected by the multiplexer 9 is then determined in accordance with the count value that is attained.

Noise Countermeasure (b)

In this case, the processing section 13 is configured to generate a random number each time that sequential A/D conversions of the input analog signals have been completed, i.e., prior to each of the time points t0, t1, t2, etc., in FIG. 12. The processing section 13 then controls the multiplexer 9 to perform the next set of A/D conversions of the respective input analog signals in a sequence that is determined in accordance with the random number that has been generated. In that way, the timings of successive A/D conversions of each of the input analog signals will vary randomly.

Figure 21:
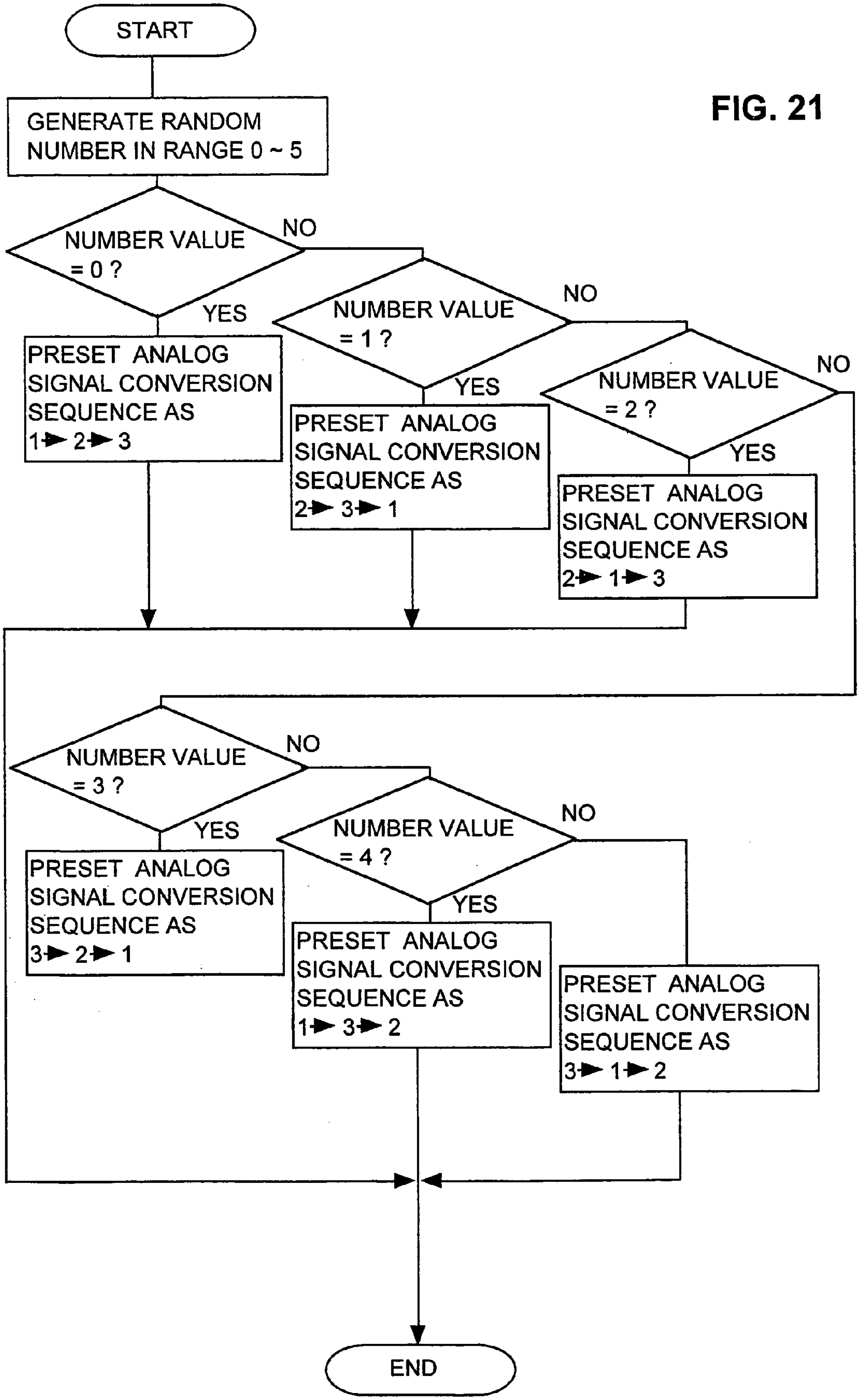
FIG. 21 is a flow diagram of processing executed to randomly vary a sequence in which a plurality of analog signals are selected for A/D conversion by a multiplexer.
Figure 22A:
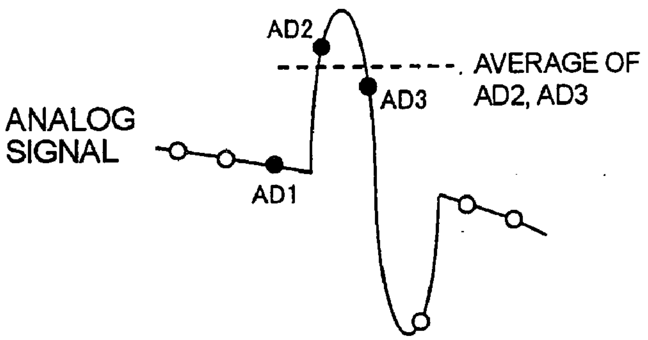
FIG. 22A PRIOR ART
FIGS. 22A to 22C are timing diagrams for use in describing related prior art technology, and associated problems.
Figure 22B:
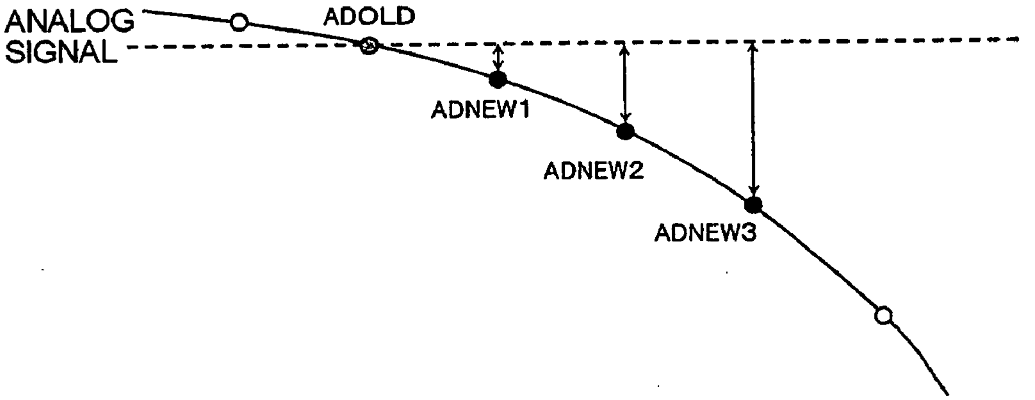
FIG. 22B PRIOR ART
Figure 22C:
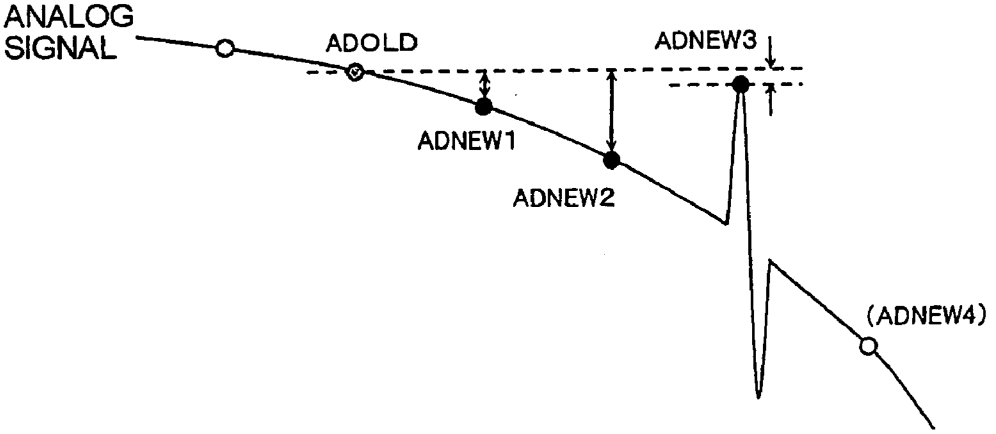
FIG. 22C PRIOR ART

FIG. 21 is a flow diagram of processing that could be executed by the processing section 13, at each of these time points t0, t1, t2, etc., to randomly determine the next sequence in which the plurality of input analog signals will be respectively inputted to the A/D converter 7 by the multiplexer 9, for the case in which there are three input analog signals. The processing sequence shown in FIG. 21 is executed prior to each of the aforementioned time points t0, t1, t2, etc., to generate a random number within a range that is equal to the total number of possible different sequences of selecting the input analog signals. The selection sequence that will next be utilized by the multiplexer 9 is then derived based on the random number that has been generated.

With either of the above methods, it can be ensured that the effects of periodically occurring noise contained in an input analog signal will be distributed with respect to the A/D conversion timings of that signal, such as to substantially eliminate the possibility of synchronization of the noise occurrences with the A/D conversion timings. The greater the number of input analog signal channels, the greater will be the effectiveness of distributing the effects of the noise, i.e., the lower will become the possibility that abnormal digital values resulting from noise will become selected as median values by the input IC 5, and so will affect the control operation of the microcomputer 3.

Various alternative forms of the above embodiments can be envisaged, as described in the following.

Alternative Form 1

With each of the above embodiments, it would be possible to omit the factor-based averaging processing of step 150 and proceed directly from step S140 to S160 in FIG. 4, or similarly, to omit step S250 and proceed directly from step S240 to S260 in FIG. 10, so that in each case, the median values obtained in step S140 of FIG. 4 or step S240 of FIG. 10 are stored directly as final values in the final result memory region 15*c* of the RAM 15.

In that case, although factor-based averaging is not applied to the median values which are derived and supplied to the microcomputer 3 for use in engine control, there is a substantially reduced possibility that A/D converted values which deviate significantly from adjacent values (due to noise in the input analog signals) will be selected as median values, as described hereinabove with respect to FIGS. 2A to 2D. Hence, the effects of noise in the input analog signals upon engine control by the microcomputer 3 are effectively reduced, even if factor-based averaging is not applied to the median values.

Alternative Form 2

With the first embodiment described above, each median value is selected from an odd-numbered set of successive A/D converted values. However the processing shown in FIG. 4 could be alternatively performed as follows. In steps S110 and S120, the latest g A/D converted values are stored in the converted data memory region 15*a*, where g is an even-numbered integer of value 4 or higher. Next, in steps S130, S140, with the g A/D converted values arranged in order of magnitude, the (g/2)-th and the (g/(2+1))-th values are detected. For example, if g is 6, then the third-largest and second-largest (i.e., the third-smallest and the fourth-smallest) of the values are detected. In steps S130, S140 the average of these two values is calculated, and in steps S150, S160 the average value is subjected to factor-based averaging processing, to obtain a final value that is stored in the final result memory region 15*c* of the RAM 15.

Hence with such an alternative configuration, similar results can be obtained to those of the first embodiment described above. It will be apparent that the processing of FIG. 10, for the third embodiment, can be similarly modified.

Alternative Form 3

This is a modification of the alternative form 2 described above. With the alternative form 3, the factor-based averaging processing of step S150 in FIG. 4 is omitted, and the average value that has been derived in steps S130, S140 is written directly into the final result memory region 15*c* of the RAM 15, as a final value. This modification can also be applied to the processing of FIG. 10, for the third embodiment.

Fourth Embodiment

Figure 14:
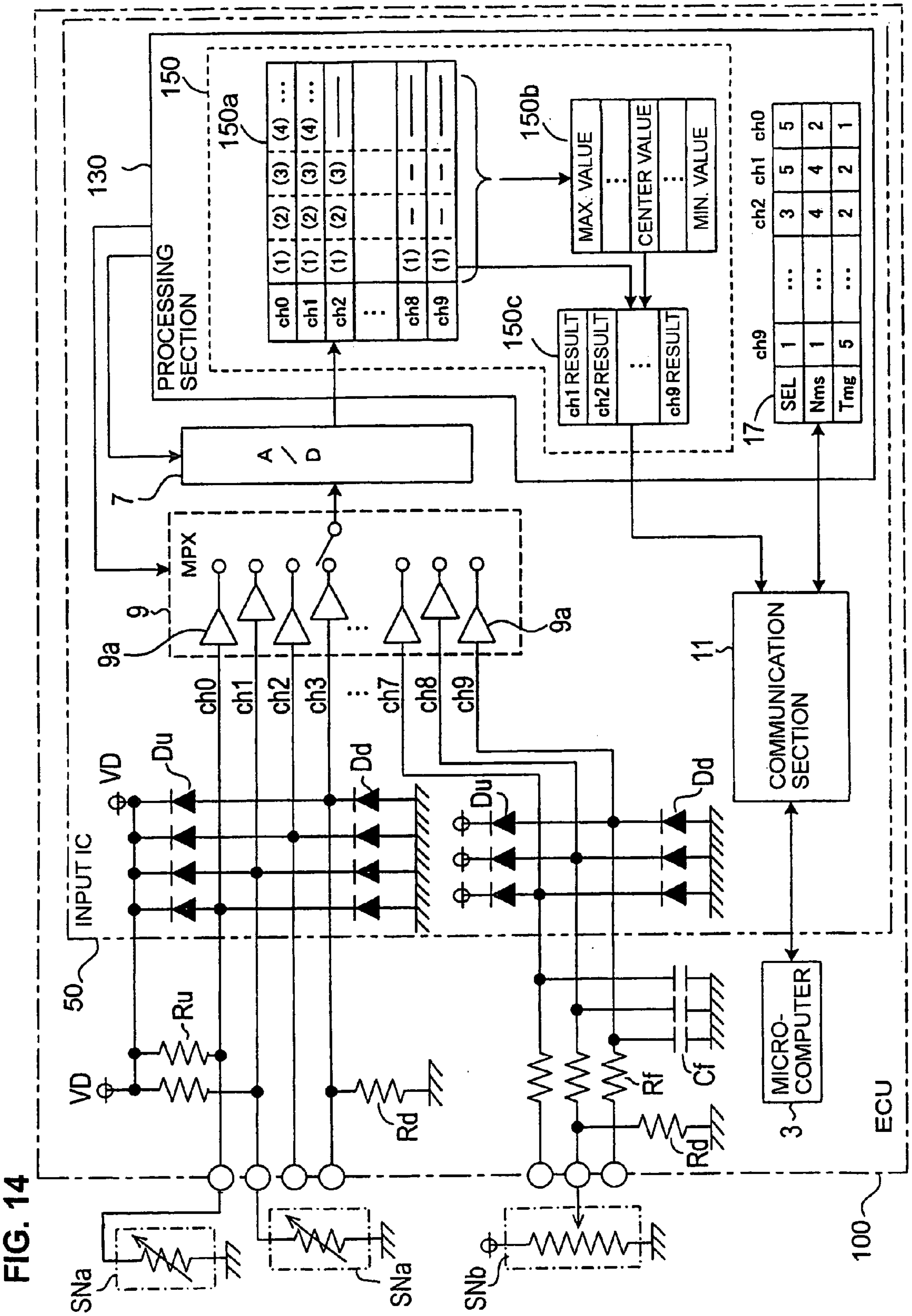
FIG. 14 is a system block diagram of a fourth embodiment of an ECU.

A fourth embodiment will be described, referring first to FIG. 14, which shows the overall configuration. In FIG. 14, components corresponding to those of the first embodiment of FIG. 1 are designated by identical reference numerals to those of FIG. 1, and detailed description of these will be omitted. As shown, an ECU 100 includes a multiplexer 9 which supplies successively selected analog signals to an A/D converter 7 in the same manner as described for the first embodiment. The multiplexer 9 has ten input terminals, to which respective analog signals are applied. In the following, each of these analog signals and the corresponding one of a set of ten digital signals (i.e., respective sequences of A/D converted values) that are produced in multiplexed form by the A/D converter 7 will be referred to as being produced by a corresponding channel of the A/D converter 7, i.e., with these channels, designated as ch0, ch1, . . . , ch9, corresponding to respective input terminals of the multiplexer 9 as shown in FIG. 14. Each signal line of a channel (i.e., connecting between an input terminal of the ECU 100 and an input terminal of the multiplexer 9) is connected to a corresponding pair of surge protection diodes Du, Dd as shown.

The ECU 100 of this embodiment includes an input IC 50, a microcomputer 3, and resistors Ru, Rd having the functions described for the first embodiment, as well as filter circuits connected in the signal lines of channels ch7 to ch9.

With the input IC 50 of this embodiment, various parameters used in processing operations can be preset separately for each of the channels ch0, ch1 . . . , ch9. These include, for example, determining whether or not median values will be derived (i.e., whether processing corresponding to steps S130 to S140 of FIG. 4 of the first embodiment will be performed) and, if that processing is to be performed, how many successive A/D converted values each median value is to be selected from. It is also possible to preset the period between successive A/D conversions of the analog signal of a specific channel, and to specify whether or not factor-based averaging processing will be applied to the median values that are derived for a channel, and, if factor-based averaging is to be performed, the value that is to be used for N in equation (1) above.

As shown in FIG. 14, the input IC 50 of this embodiment is made up of an A/D converter 7, a multiplexer 9, a communication section 11, a RAM 15, and surge protection diodes Du, Dd, and further includes a processing section 130, and a communication section 11 for use in communication with the microcomputer 3.

The processing section 130 includes a RAM 15 and a data register 17. The data register 17 serves to hold sets of preset values that determine the presettable conditions described above, with these sets respectively corresponding to the channels ch0, ch1 . . . , ch9. The RAM 15 shown in FIG. 14 corresponds in function to that of the first embodiment of FIG. 1, having n converted data memory region 15*a*, a sorting processing-use memory region 15*b* and a final result memory region 15*c*, but is shown in greater detail in order to illustrate how respective sets of digital values of the various channels are stored.

In each of the sets of preset values corresponding to the respective channels, held in the data register 17, SEL denotes a variable whose value determines whether median value calculation processing is to be performed for the corresponding channel, and if that processing is to be performed, the number of A/D converted values from which each median value is to be selected. Each set also includes a variable Tmg, whose value determines the period between successive A/D conversions, for the corresponding channel. Each set also includes a variable Nms, whose value determines whether or not factor-based averaging is to be performed, and, if it is to be performed, the value of N in equation (1) above.

SEL is predetermined as an odd-numbered positive integer, whose value determines whether or not median value calculation is to be performed for the corresponding channel, and, if it is to be performed, the number of A/D converted values from which each median value is to be selected. If for example SEL equals 3, this signifies that median value calculation processing is to be performed, with each median value selected from three successive A/D converted values. If SEL equals 1, then this signifies that median value calculation processing is not to be performed for the corresponding channel.

A value of A/D conversion period is expressed by Tmg as $(128\times2^{Tmg})$ $\mu$S. Thus for example if Tmg equals 0, then the A/D conversion period for the corresponding channel is to be 128 $\mu$S, while if Tmg equals 2, then the A/D conversion period is 512 $\mu$S.

The value preset for Nms determines whether or not factor-based averaging is to be applied to digital values derived for the corresponding channel, and, if it is to be applied, the value for the factor N. If for example Nms equals 4, then a value of 4 is used as N in equation (2), i.e., ¼ factor-based averaging processing is applied to median values that are derived for the corresponding channel, while if Nms equals 1 then this signifies that factor-based averaging is not to be applied to median values that are derived for the corresponding channel.

It will be assumed that a value of 5 is set for SEL, for each of the channels ch0 and ch1, thereby specifying that each median value will be selected from five successive A/D converted values. It will further be assumed that a value of 3 is set as SEL, for channel ch2, so that each median value will be selected from three successive A/D converted values. It will also be assumed that an odd-numbered value other than 1 is set as SEL, for each of the channels ch3 to ch6, while for each of the channels ch7 to ch9, SEL is set as 1 (signifying that median value calculation processing is not to be applied to these channels).

In addition, Nms is set as 2 for channel ch0, is set as 4 for each of the channels ch1, ch2, and is set as 1 for each of the channels ch7 to ch9 (so that factor-based averaging is not applied to channels ch7 to ch9).

Tmg is set as 1 for channel ch0 (designating an A/D conversion period of 256 $\mu$S), while Tmg is set as 2 for each of channels ch1, ch2 (designating an A/D conversion period of 512 $\mu$S), and Tmg is set as 5 for each of channels ch7 to ch9 (designating an A/D conversion period of 4096 $\mu$S).

With this embodiment, respective (analog) low-pass filters each formed of a resistor Rf and capacitor Cf are connected to the input signal lines of channels ch7 to ch9, i.e., the channels for which median value calculation processing is not performed. It can thereby be ensured that noise filtering is applied to the analog signals of these channels, while also ensuring that corresponding derived digital values that are supplied to the microcomputer 3 can accurately follow rapid changes in level of these analog signals. These analog signals of channels ch7 to ch9 are of the second type described hereinabove, which exhibit sudden changes in level, such as signals produced by internal pressure sensors of the engine cylinders, anti-knock sensors, etc., or signals that are not synchronized to a timebase, such as a sensor signal that varies each time a specific crankshaft angle is attained by the engine, etc.

Each of the channels ch0 to ch6, for which median value processing is performed, is not provided with such an analog low-pass filter circuit, and conveys an analog signal that is of the first type described hereinabove, i.e., a signal that changes in level only relatively gradually, such as a cooling water temperature sensor signal, an oil temperature sensor signal, an air intake temperature sensor signal, or a signal that is produced by voltage division of the supply voltage VD of the ECU 100 by a resistive voltage divider formed of the internal resistance of a corresponding sensor Sna and an internal resistor Ru within the ECU 100.

The processing section 130 of the input IC 50 of this embodiment controls the multiplexer 9 such as to perform changeover of A/D conversion operations for each channel at timings determined by the value of Tmg for that channel, and stores each resultant A/D converted value produced from the A/D converter 7 in a region of the converted data memory region 15*a* that is reserved for that channel, as illustrated in FIG. 14.

If a value other than 1 has been set as SEL for a channel, then the processing section 130 stores a number of successively produced A/D converted values (in the aforementioned region of the converted data memory region 15*a* reserved for that channel) that is equal to the value of SEL. Thus for example if SEL for that channel is 5, then at any point in time, the five most recently produced A/D converted values for that channel are held in the corresponding region of the converted data memory region 15*a*. These are copied into the sorting processing-use memory region 15*b*, to be subjected time point sorting processing as described above for the first embodiment, to thereby obtain the median value of the most recent set of A/D converted values for that channel. The final result memory region 15c contains a plurality of regions respectively reserved for the channels, i.e., with the final values derived for a channel being successively stored in the corresponding region of the final result memory region 15c. Each time a median value is derived for a channel, it is subjected to factor-based averaging by the processing section 130 to obtain an updated final value, using a value for N that is determined by Nms for that channel, and being operated on in conjunction with the most recently derived final value for that channel (read out from the final result memory region 15c). However if the value of Nms for that channel is 1, then factor-based averaging is not performed, and each median value is stored directly, as a final value, in the region of the final result memory region 15c corresponding to that channel.

If the value of SEL specified for a channel is 1, then the processing section 130 stores each most recently derived A/D converted value in succession in the region of the converted data memory region 15a corresponding to that channel. Factor-based averaging processing is performed on each successive set of A/D converted values for a channel that are held in the converted data memory region 15a, using a value of N that is determined by Nms for that channel. Each result thereby obtained is stored in the region of the final result memory region 15c corresponding to that channel, as an updated final value.

However if the value of Nms for that channel is 1, then factor-based averaging processing is not performed, and each most recent A/D converted value obtained for that channel is transferred from the converted data memory region 15a directly to the region of the final result memory region 15c reserved for that channel, as an updated final value.

In the same way as for the first embodiment, the microcomputer 3 of this embodiment communicates with the input IC 50 at fixed periodic intervals, e.g., once every 4 ms, to send data acquisition requests. In response to such a request, the input IC 50 reads out, from each of the regions of the final result memory region 15c corresponding to the respective channels, the most recent final values that have been derived for the channels, and also the respective values that have been stored in the data register 17 for the variables SEL, Nms and Tmg for the various channels, and transmits all of these data to the microcomputer 3.

When the microcomputer 3 transmits a single-shot A/D conversion request (as defined and described hereinafter) to the input IC 50, at some arbitrary time point (i.e., an asynchronous timing, at which an A/D converted value from a specified channel becomes necessary), the processing section 130 performs processing whereby a single A/D conversion of the analog signal of the specified channel is performed, and the resultant A/D converted value is transmitted directly to the microcomputer 3.

It would be possible to fixedly stored respective preset values for the aforementioned variables Sel, Tmg, Nms in the processing section 130. However with this embodiment, these values are transmitted from the microcomputer 3 to the input IC 50, to be stored in the input IC 50, and so can be readily altered by operation of the microcomputer 3. In that way, the input IC 50 can be used as an ECU that is readily applicable to various different types of vehicle. In addition, the microcomputer 3 can update the values of one or more of these variables at any time, for any of the channels, to be appropriate for the current operation condition of the vehicle engine, so that highly accurate control can be achieved.

When the microcomputer 3 receives data sent from the input IC 50 in response to a data acquisition request as described above, it compares the values for SEL, Nms and Tmg for the various channels that are contained in the received data with respective values for these that are held stored at the microcomputer 3, i.e., which had been previously transmitted to the input IC 50 from the microcomputer 3 to be stored in the data register 17. The received values for SEL, Nms and Tmg for the various channels are thereby checked, so that the microcomputer 3 can detect when the values stored in the data register 17 have become altered, e.g., due to the effects of electrical noise. If one or more of the received values do not match the corresponding values for the variables that were previously transmitted from the microcomputer 3 to the input IC 50 to be stored in the data register 17, then all of the accompanying data (i.e., updated final values corresponding to the respective channels) are deleted, so that these will not be used by the microcomputer 3 for control purposes. The microcomputer 3 then transmits a reset signal to the input IC 5, whereby the operation of the input IC 5 is reset, and sets of values for the variables SEL, Nms and Tmg, for the various channels, are then transmitted by the microcomputer 3 to be stored in the data register 17 of the input IC 50.

Figure 15:
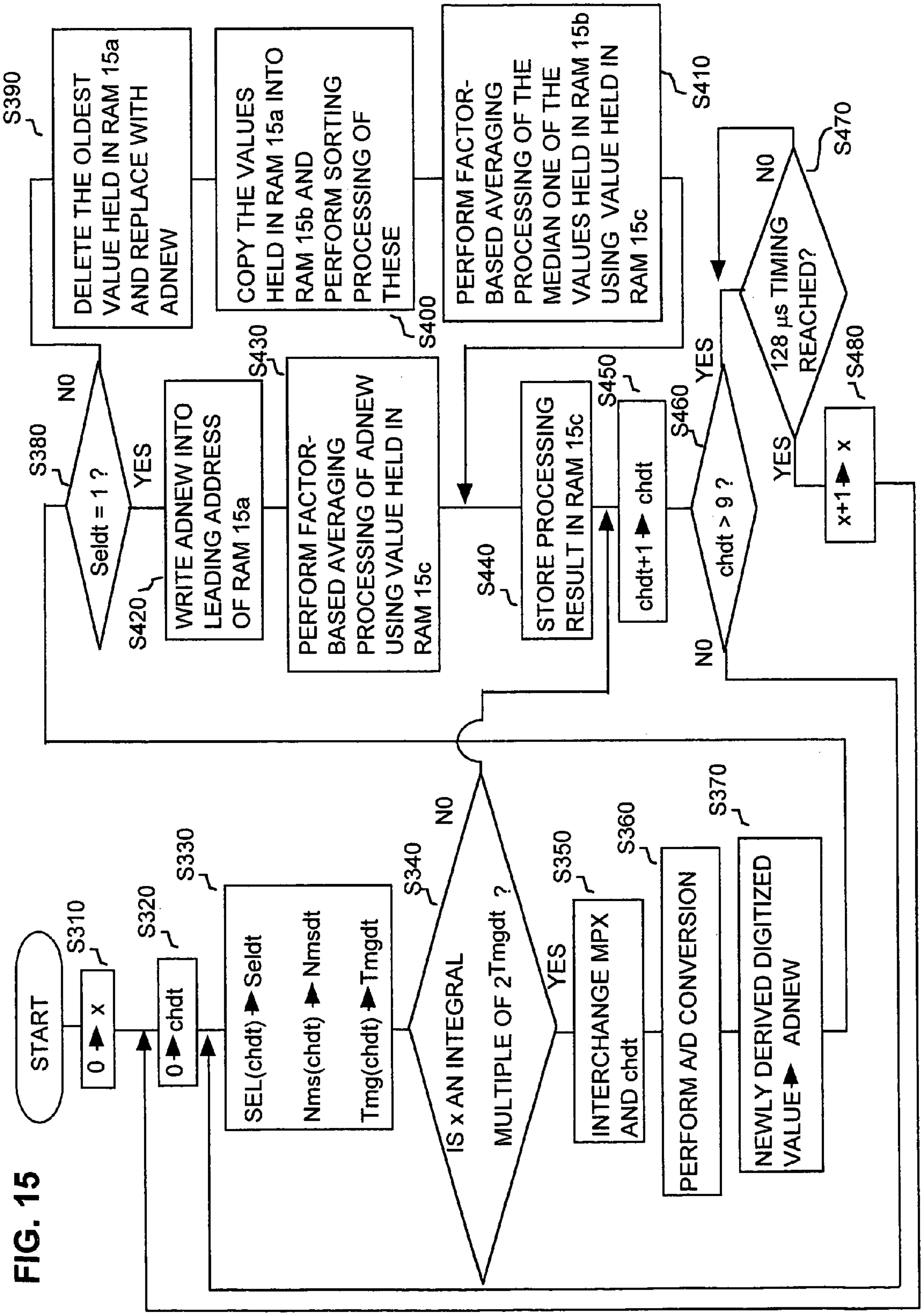
FIG. 15 is a flow diagram of processing executed by a processing section of an input IC of the fourth embodiment, whereby processing of A/D converted values is performed in accordance with values for variables that have been stored in a memory.

The processing executed by the processing section 130 and the microcomputer 3 of this embodiment will be described in the following referring to the flow diagrams of FIGS. 15 to 17. FIG. 15 shows processing that is executed by the processing section 130 for each of the analog signals of the respective channels, whereby A/D conversion and subsequent processing of a resultant A/D converted value are performed in accordance with the set of values for SEL, Nms and Tmg (corresponding to the channel concerned) that are held in the data register 17.

When power begins to be supplied to operate the input IC 50, or when a reset signal transmitted from the microcomputer 3 is received by the input IC 50, the processing section 130 performs initialization processing, to be thereby reset to a predetermined initial condition. In step S620 of the flow diagram of FIG. 17, described hereinafter, sets of initial values for SEL, Nms and Tmg (with each set corresponding to a specific channel), transmitted from the microcomputer 3, are written into the data register 17. Thereafter, the processing shown in FIG. 15 is started. In the following description, the symbol "x" is used to represent a variable that is an integer whose value expresses the number of 128 us intervals that have elapsed from the start of processing by the processing section 130 up to the current time point. "chdt" represents a variable having a value in the range 0 to 9, with the current value of chdt indicating the channel which is currently being operated on. "SEL(chdt)", "Nms (chdt)" and "Tmg(chdt)" are variables representing respective values that have been set in the data register 17 for the channel that is currently being operated on.

In FIG. 15, firstly in step S310, x is initialized to 0, and in step S320 chdt is initialized to 0. In step S330, the respective values for SEL, Nms and Tmg corresponding to the channel whose number is specified by chdt are read out from the data register 17, and these values are registered as Seldt, Nmsdt and Tmgdt respectively. Next in step S340, a decision is made as to whether or not the value of x is an integral multiple of $2^{Tmgdt}$. If so (i.e., YES decision in step S340) operation proceeds to step S350, in which the multiplexer 9 performs switching whereby the analog signal of the channel whose number corresponds to chdt is inputted to the A/D converter 7. Next, in step S360, an A/D conversion is performed by the A/D converter 7, and in step S370 the resultant A/D converted value is stored as ADNEW.

In the following, the channel whose number corresponds to chdt, i.e., the one of the channels ch0, ch1, . . . , ch9 that is being operated on in the current execution of the processing of FIG. 15, will be referred to simply as "channel chdt".

In step S380 a decision is made as to whether or not Seldt is 1. If it is not 1, then since this signifies that median value calculation processing is to be performed for channel chdt, operation proceeds to step S390. As described for the first embodiment, the region of the converted data memory region 15*a* that is reserved for a channel serves to hold a set of the most recently derived A/D converted values for that channel, (in this case, the channel whose number corresponds to chdt, while the number of A/D converted values constituting the set is determined by Seldt). In step S390, the oldest one of that set of A/D converted values is replaced by the most recent value, i.e., ADNEW.

That is to say, the converted data memory region 15*a* contains a set of addresses, reserved for storing the most recent A/D converted values for channel chdt, with the number of these addresses being specified by Seldt. In the same way as for step S120 of FIG. 4 of the first embodiment, the one of these addresses that contains the oldest A/D converted value has the new value ADNEW written in, to overwrite the oldest value.

In step S400, in the same way as for steps S130, S140 of FIG. 4, the set of A/D converted values for channel chdt that are held in the converted data memory region 15*a* are copied into the region of the sorting processing-use memory region 15*b* that is reserved for the chdt channel, and sorting processing is applied to these values. That set of A/D converted values are thereby arranged in order of magnitude, and the median value is obtained.

Next in step S410, that median value is read out from the sorting processing-use memory region 15*b* and subjected to factor-based averaging in conjunction with the most recent final value that was obtained (i.e., by factor-based averaging) for channel chdt, with the latter final value being read out from the region of the final result memory region 15*c* that is reserved for channel chdt. The value for N that is used in the factor-based averaging calculation is Nmsdt. That is, the median value that is read out from the sorting processing-use memory region 15*b* is used as the "currently derived median value $V_m$", while the final value that is read out from the final result memory region 15*c* is used as $V_{n-1}$, in equation (1) above.

Operation the proceeds to step S440, in which the result obtained in step S410 is stored, as an updated final value obtained for channel chdt, in the region of the final result memory region 15*c* reserved for that channel.

Although not explicitly shown in FIG. 15, if it is found in step S410 that Nmsdt is 1, then since this indicates that a value for N of 1 would be used in equation (2), this actually signifies that factor-based averaging is not to be applied to the median values derived for channel chdt, and so in step S440 the median value that was derived in step S400 is written directly into the final result memory region 15*c*, as an updated final value for channel chdt.

On the other hand, if it is found that Seldt is 1, in step S380, then this indicates that median value calculation is not to be applied to channel chdt, and in that case, operation proceeds to step S420.

In step S420, ADNEW is written into the region of the converted data memory region 15*a* reserved for channel chdt, then in step S430 the value ADNEW is read out and subjected to factor-based averaging processing in conjunction with the most recent final value that had been derived for channel chdt, read out from the final result memory region 15*c*, with the factor N used in the factor-based averaging being the value of Nmsdt.

Hence in this case, in the calculation of equation (1), ADNEW constitutes the aforementioned "currently derived median value $V_m$", Nmsdt is N, and "the most recent value obtained by factor-based averaging processing, $V_{n-1}$" is the previously derived final value corresponding to channel chdt, read out from the final result memory region 15*c*.

Operation proceeds to step S440, in which the result obtained in step S430 is written into the region of the final result memory region 15*c* reserved for channel chdt, as an updated final value for that channel. However if it is found in step S430 that the value of Nmsdt is 1, then this indicates that a value 1 is to be used for N in equation (1), so that in fact factor-based averaging is not applied. In that case, in step S440, ADNEW is written directly into the region of the final result memory region 15*c* reserved for channel chdt, as an updated final value for that channel.

When step S440 has been executed, with the result obtained in step S410 or step S430 having been written into the region of the final result memory region 15*c* reserved for channel chdt, operation proceeds to step S450, in which the value of chdt is incremented by 1.

If it is found in step S340 that the value of x is not an integral multiple of $2^{Tmgdt}$, then operation proceeds to step S450, to increment chdt. Following step S450, a decision is made as to whether or not the value of chdt exceeds 9, to thereby determine whether all of the channels ch0, ch1 . . . , ch9 have been processed. If chdt is not greater than 9 then operation returns to step S330, while if it is greater than 9 then operation proceeds to step S470, to wait until a time has elapsed (following the start of operation) that is a multiple of 128 μs. When that point is reached (YES decision in step S470), step S480 is executed, to increment the value of x by 1. Operation then returns to step S320.

After the processing of FIG. 15 has started, each time an interval of 128 μs has elapsed, the processing steps from step S320 onward are executed, after the value of x has been incremented by 1, i.e., x takes the successive values 0, 1, 2, 3, . . .

Thus if for example there is a channel for which the corresponding value of Tmg that has been stored in the data register 17 is 0, then a YES decision will be reached each time step S340 is executed in the sequence of steps from step S320 onward, with respect to that channel, i.e., once in every 128 μs, and steps S350 to S440 will be executed using the values for SEL and Nms that have been stored in the data register 17 for that channel.

Similarly if example there is a channel for which the corresponding value of Tmg has been preset as 1, then a YES decision will be reached each time step S340 is executed once in every two executions of the sequence of steps from step S320 onward (i.e., when x takes the successive values 0, 2, 4, 6, . . . ), with respect to that channel, so that each time a 256 μs interval has elapsed, A/D conversion and subsequent processing will be performed for the analog signal of that channel (in accordance with the values for SEL and Nms that have been stored in the data register 17 in correspondence with that channel) by execution of steps S350 to S440.

Similarly if example there is a channel for which the corresponding value of Tmg has been preset as 2, then a YES decision will be reached each time step S340 is executed once in every four executions of the sequence of steps from step S320 onward (i.e., when x takes the successive values 0, 4, 8, 12, . . . ), with respect to that channel, so that each time a 512 μs interval has elapsed, and A/D conversion and subsequent processing will be performed in accordance with the values for SEL and Nms that have been stored in the data register 17 for that channel, by execution of steps S350 to S440.

Figure 16:
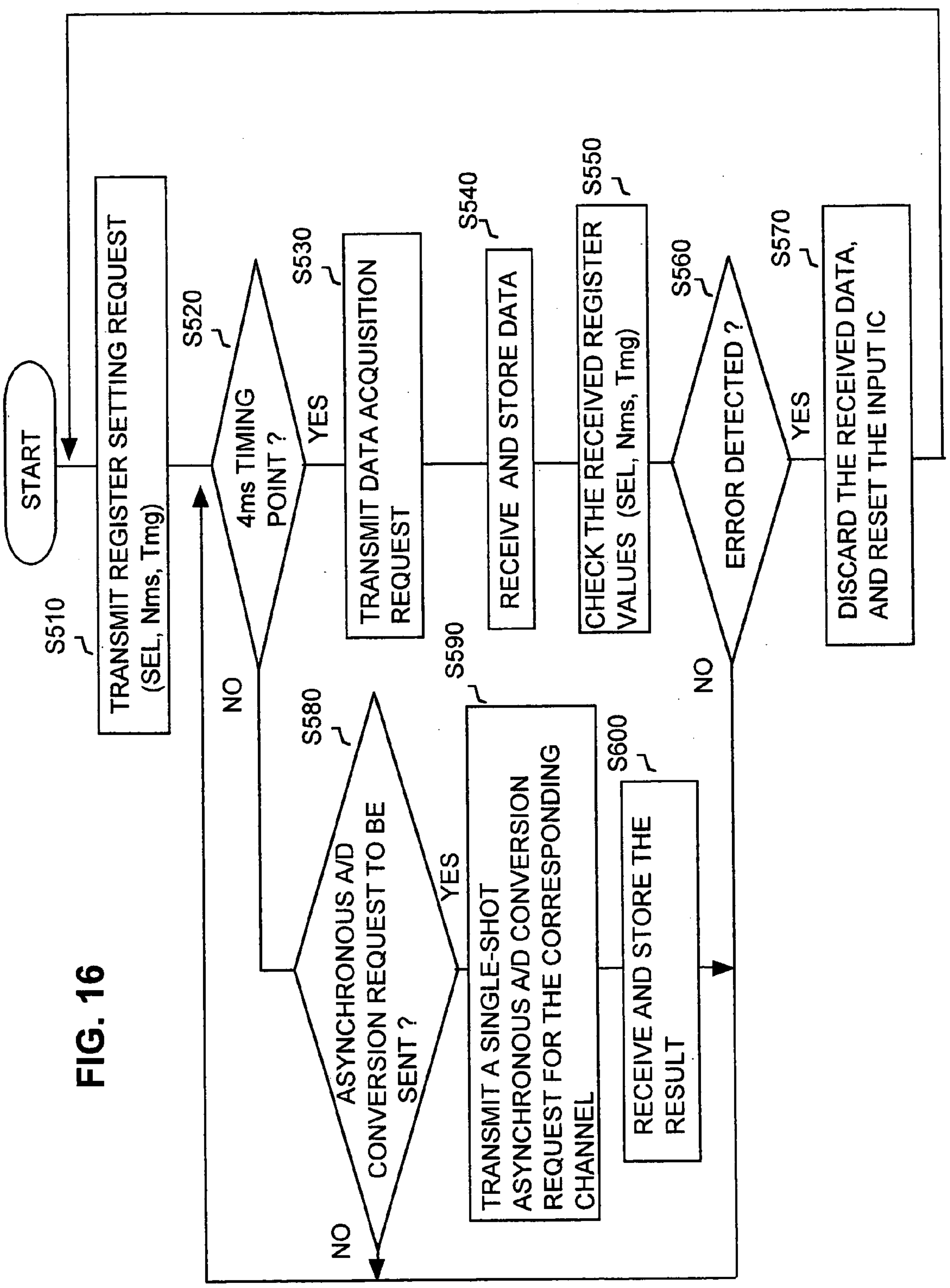
FIG. 16 is a flow diagram of processing that is executed by a microcomputer of the fourth embodiment for data communication with the input IC.

FIG. 16 is a flow diagram of a corresponding processing sequence that is executed by the microcomputer 3 for communication with the input IC 50. Each time the operation of the microcomputer 3 is started, or a reset signal is inputted to the microcomputer 3, the processing of FIG. 16 is started. Firstly in step S510, a register value setting request is transmitted to the input IC 50. This is a request that respective sets of values of SEL, Nms and Tmg for the various channels, transmitted from the microcomputer 3, are to be written into the data register 17 of the input IC 50. The format of a register value setting request is shown in FIG. 18A, with the request being made up of a command portion (binary 00) and a portion containing respective sets of values for SEL, Nms and Tmg for each of the channels ch0, ch1, . . . ch9.

When the input IC 50 receives a register value setting request from the microcomputer 3, in step S510 of FIG. 16, it performs initial register value setting, whereby each of the sets of values for SEL, Nms and Tmg for the various channels, contained in that request are written into the data register 17.

Next, in step S520, a decision is made as to whether or not a time point has been reached at which the processing of FIG. 16 is to be started, with such a time point being reached once in every 4 ms. If such a time point has been reached, then operation proceeds to step S530, in which a data acquisition request is transmitted to the input IC 50. The format of such a request is shown in FIG. 18A, i.e., consisting only of a command portion (in this example, binary 10), and it constitutes a request for the input IC 50 to read out the data (i.e., respective final values) held in the final result memory region 15*c* corresponding to the various channel.

When the input IC 50 receives a data acquisition request, then a step S640 in the flow diagram of FIG. 17 (described hereinafter) is executed whereby data for the respective channels that are currently held in the RAM 15, and the sets of values for SEL, Nms and Tmg that have been registered in the data register 17 for the respective channels, are read out and transmitted to the microcomputer 3. In the next step S540 of FIG. 16, the microcomputer 3 stores the received data and the received values for the variables in a memory, such as RAM.

Next in step S550, the microcomputer 3 performs checking processing to judge whether or not the values for SEL, Nms and Tmg for each of the channels, received and stored in step S540, correspond to original values that are held in the microcomputer 3 (i.e., values that had been previously transmitted from the microcomputer 3 to be stored in the data register 17 of the input IC 50). In step S560 a decision is made as to whether or not an error (i.e., mismatch) has been detected by the checking processing.

If no error has been detected, then operation returns to S520, while if an error has been detected, then since this indicates that at least one incorrect value has become registered in the data register 17 of the input IC 50, e.g., due to the effects of noise, operation proceeds to step S570 in which the updated final values derived for the respective channels, received and stored in the preceding execution of step S540, are deleted. It is thereby ensured that these data will not be used in controlling the vehicle engine. Resetting of the input IC 50 is then performed. Operation then returns to step S510, so that setting of the contents of the data register 17 is again performed, so that correct sets of values for SEL, Nms and Tmg for the various channels are now held in the data register 17.

If it is found in step S530 that a 4 ms time point has not yet been reached, operation proceeds to step S580, in which a decision is made as to whether an asynchronous A/D conversion request is to be issued for any channel (i.e., a request for a single A/D conversion of the analog signal of the specified channel). Such an asynchronous A/D conversion request may be transmitted by the microcomputer 3 at any arbitrary point in time, e.g., when the engine crankshaft attains a predetermined angular position, or when a specific externally produced signal is inputted to the microcomputer 3, etc. With this embodiment, an asynchronous A/D conversion request can be issued only with respect to each of the channels ch7 to ch9, each of which is provided with a filter circuit for the corresponding analog signal as described hereinabove.

If a NO decision is reached in step S580 then operation returns to step S520, while if a YES decision is reached, operation proceeds to step S590 in which a single-shot A/D conversion request that specifies one of the channels ch0, ch1 . . . , ch9 is transmitted to the input IC 50.

Issuing of a single-shot A/D conversion request signifies that an A/D conversion of the analog signal of the specified channel is to be performed immediately. The format of a single-shot A/D conversion request is shown in FIG. 18A. This is made up of a command portion (in this example, binary 11) and the channel number, specifying the channel for which A/D conversion is to be performed.

When the input IC 50 receives a single-shot A/D conversion request, then step S660 and step S670 of the flow diagram of FIG. 17 (described hereinafter) are executed, whereby an A/D conversion is performed on the analog signal of the specified channel, and the resultant value is transmitted to the microcomputer 3. When the microcomputer 3 receives that A/D converted value, it is stored in memory such as RAM (step S600 in FIG. 16) and operation proceeds to step S520. The A/D converted value that was stored in step S600 is then used in conjunction with the data that were stored in step S550, for engine control purposes.

Figure 17:
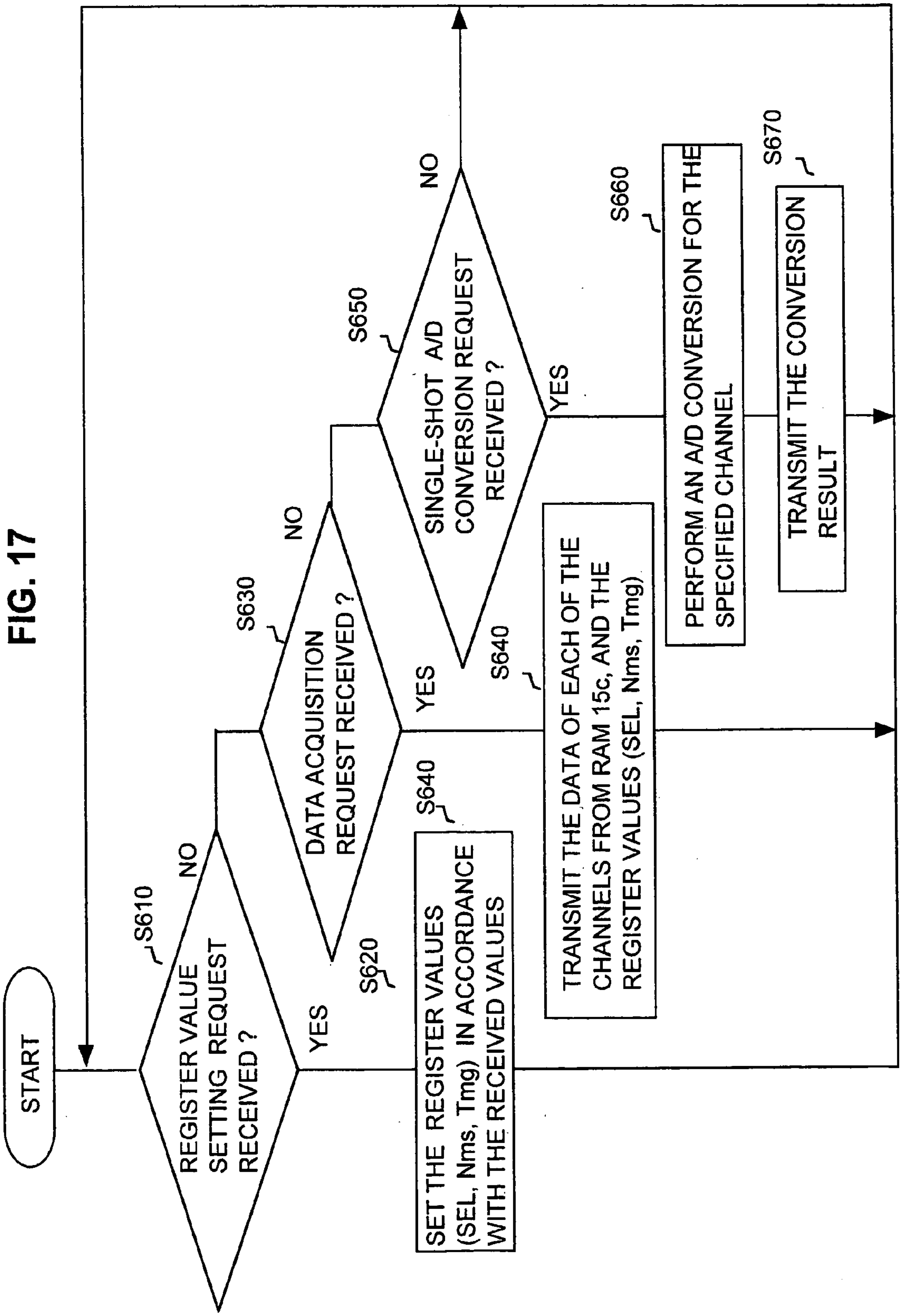
FIG. 17 is a flow diagram of processing that is executed by the input IC of the fourth embodiment for data communication with the microcomputer of that embodiment.

The processing shown in the timing diagram of FIG. 17 is executed by the processing section 130 of the input IC 50 for communicating with the microcomputer 3. As shown in FIG. 17, when operation of the processing section 130 is started, then firstly in step S610 a decision is made as to whether or not a register value setting request has been received from the microcomputer 3. If such a request has been received (YES decision in step S610), then operation proceeds to step S620, in which register setting is performed by writing into the data register 17 (i.e., into the region corresponding to the channel whose channel number is specified in the request) the values for SEL, Nms and Tmg that are specified in the request. When this is completed, operation then returns to step S610.

If it is judged in step S610 that a register value setting request has not been received, then operation proceeds to step S630, in which a decision is made as to whether or not a data acquisition request has been received from the microcomputer 3. If a data acquisition request has been received (YES decision in step S630), then operation proceeds to step S640, in which the data held in the final result memory region 15*c* (i.e., most recently derived final values corresponding to each of channels) and the sets of values of SEL, Nms and Tmg corresponding to the respective channels, held in the data register 17, are read out and transmitted to the microcomputer 3. Operation then returns to step S610.

FIG. 18B shows the format in which the set of values for SEL, Nms and Tmg held in the data register 17 for one channel, and the most recently derived final value corresponding to that channel, held in the final result memory region 15*c*, are transmitted together as a frame from the input IC 50 to the processing section 130. In step S640 successive ones of these frames, corresponding to each of the channels, are transmitted sequentially to the microcomputer 3. However it should be noted that it would be equally possible to transmit each set of values for SEL, Nms and Tmg held in the data register 17, corresponding to a channel, and the final value that is held in the final result memory region 15*c*, corresponding to that channel, as respectively separate frames. When the data and variable values for all of the channels have been transmitted in step S640, operation then returns to step S610.

If it is judged in step S630 that a data acquisition request has not been received, then operation proceeds to step S650 in which a decision is made as to whether or not a single-shot A/D conversion request has been received. If a single-shot A/D conversion request has not been received (NO decision in step S650) then operation returns to step S610, while if such a request has been received (YES decision in step S650) then operation proceeds to step S660.

In step S660, the multiplexer 9 selects the analog signal of the channel whose channel number is specified in the single-shot A/D conversion request, so that an A/D conversion of that signal is performed by the A/D converter 7. The resultant A/D converted value is then transmitted to the microcomputer 3, and operation returns to step S610.

It should be noted that it would be equally possible to implement step S660 as follows. The processing of steps S350 to S370 and steps S420 to S440 of the flow diagram of FIG. 15 would be executed for the channel specified in the received single-shot A/D conversion request (i.e., with the final value being stored in the memory region 15*c*), and in step S670, that final value for the specified channel would be read out and transmitted to the microcomputer 3. In that case, if the value for Nms held for the specified channel in the data register 17 is 1, then the same effect as that described above would be achieved, i.e., with a single A/D converted value being transmitted to the microcomputer 3 in response to the single-shot A/D conversion request.

In the above description, a data acquisition request transmitted from the microcomputer 3 represents a request for all of the data held for each of the respective channels in the final result memory region 15*c* (and their respective currently held values of the variables SEL, Nms and Tmg) to be transmitted from the input IC 50. However it would be equally possible to configure the system such that the microcomputer 3 can transmit a data acquisition request which conveys the channel number of a specific channel, so that requests for {most recent data+ values for the variables} can be transmitted respectively separately for each of the channels, one at a time. The input IC 50 would respond by transmitting to the microcomputer 3 the most recent final value corresponding to the specified channel, held in the final result memory region 15*c*, and the values of SEL, Nms and Tmg for the specified channel that are currently held in the data register 17.

With the fourth embodiment described above, the channels ch0 to ch6 of the ten channels ch0, ch1, . . . , ch9 of the A/D converter 7 process respective analog signals, produced from the sensors designated SNa, that vary relatively slowly, for example the output signal from a water temperature sensor, or from an oil temperature sensor, or air intake temperature sensor, etc., or signals that are produced by voltage division of the supply voltage VD in a resistive voltage divider formed of the internal resistance of the sensor Sna and a resistor Ru provided within the ECU 100. No analog filter circuits are provided for these input analog signals. As described above, median value calculation processing is performed on the A/D converted values derived for each of these input analog signals (i.e., as shown in FIG. 15, with steps S390, S400 being executed when there is a NO decision in step S380).

The channels ch7~ch9 on the other hand must process analog signals which can vary extremely rapidly, for example the sensor signal from an engine pressure sensor, or from a knock sensor, etc. These signals are asynchronous, e.g., being produced at timings when the engine crankshaft attains a specific angular position. Respective analog filter circuits are provided in the ECU 100, through which these analog signals are transferred to the multiplexer 9, and median value processing is not applied to the A/D converted values of these analog signals (i.e., as shown in FIG. 15, with step S420 being executed when there is a YES decision in step S380).

It can thus be understood that with the above embodiment, since analog filter circuits are not provided for those analog signals that are to be subjected to A/D conversion but which vary only gradually, or analog signals that are produced by voltage division of the supply voltage VD, the number of components required to implement the ECU 100 can be reduced. However the digital processing (selection of median values, smoothing processing of the median values) that is applied to the A/D converted values of these analog signals serves to remove noise that may be present in the power supply voltage VD and may be thereby introduced into analog signals that are derived based on voltage division of that power supply voltage.

In the case of analog signals which can vary extremely rapidly, by performing noise removal only by means of analog filter circuits (i.e., which can have response characteristics that are designed to be appropriate for the variation characteristics of these analog signals) rather than by processing the resultant A/D converted values, it can be ensured that the A/D converted values accurately represent these analog signals, without the danger that valid signal values will be erroneously excluded as noise.

Furthermore in the ECU 100 of the fourth embodiment, the input IC 50 can perform various types of settings, for example to determine whether or not median value processing is to be applied to any specific one of the channels of the A/D converter 7, based upon the values that have been stored for the variables SEL, Nms and Tmg for that channel in the data register 17. Moreover if it is determined that median value processing is to be applied for a channel, the number of successively derived A/D converted values from which each median value is to be selected can be specified separately for each channel. It is also possible to specify the A/D conversion interval separately for each of the channels, and whether factor-based averaging is to be applied to median values or to A/D converted values derived for a channel, and, when factor-based averaging is to be applied, the value of N that is to be used in equation (1) above. When the operation of the microcomputer 3 is started, it communicates with the input IC 50 to establish initial values for respective variables that are to be stored in the data register 17, to thereby determine the various conditions described above for each of the individual channels.

It can thus be understood that an electronic control apparatus that incorporates the input IC 50 of the fourth embodiment described above can readily be adapted for use in various different applications, having respectively different control specifications.

Furthermore, with the ECU 100 of the fourth embodiment, when the microcomputer 3 receives the aforementioned data for the respective channels that have been read out by the input IC 50 from the final result memory region 15*c*, it also receives the sets of values (corresponding to respective channels) of SEL, Nms and Tmg that are currently held stored in the data register 17 of the input IC 50, and the microcomputer 3 can thereby check whether these received values of SEL, Nms and Tmg respectively correspond to the values for these which are held in the microcomputer 3 and which were previously transmitted to the input IC 50 (i.e., S550 of FIG. 16). If any error is detected (i.e., YES in step S560) then the data (i.e., respective sets of final values) which had been read out from the final result memory region 15*c* and transmitted to the microcomputer 3 are deleted, ensuring that these will not be used in engine control operations. Setting of correct values for SEL, Nms and Tmg into the data register 17 is then again performed (i.e., S510).

As a result, it becomes possible to detect when any of the register values held in the data register 17 (i.e., respective sets of values for SEL, Nms and Tmg for the various channels) become altered by the effects of noise, etc. It can also be ensured that such erroneous values will not have any effect upon engine control.

In addition, the microcomputer 3 not only effects initial setting of the register values in the data register 17 when operation is started, but also can subsequently send register value setting request to the input IC 50. When such a request is received, the register values held in the data register 17 for the channel whose number is specified in the register value setting request are changed to the values that are contained in the request. In that way, the values held for the variables SEL, Nms and Tmg, for any specific channel, can be updated in accordance with the current operating conditions of the vehicle engine. Thus for example, it becomes possible to alter the values for SEL, Nms and Tmg such that these become smaller, when the engine speed is high, than when the engine speed is low. In that way derivation of the final values from the input analog signals, for control use by the microcomputer 3, can be performed in an optimum manner in accordance with the current status of the controlled device (e.g., vehicle engine). Increased accuracy of control can thereby be achieved.

Modified Form of Fourth Embodiment

In some cases, an analog signal that is to be used for control purposes is a two-mode signal, i.e., consisting of intervals in which the signal level varies only in a gradual manner (referred to in the following as background level interval) and specific short intervals in which the signal level varies abruptly. An examples of this is a sensor signal that is produced by a method such as that of Japanese Patent Laid-open No. 11-201935, whereby the current flowing in an air/fuel ratio sensor elements is converted to a sensor voltage by means of a resistor, and whereby the impedance of the sensor element is measured by abruptly changing the voltage applied thereto, resulting in an abrupt variation interval of the sensor signal. The air/fuel ratio is measured based on the relationship between the sensor voltage levels during the background level intervals and the abrupt variation intervals. With the present invention, such a two-mode detection signal can readily be processed as follows.

Figure 19:
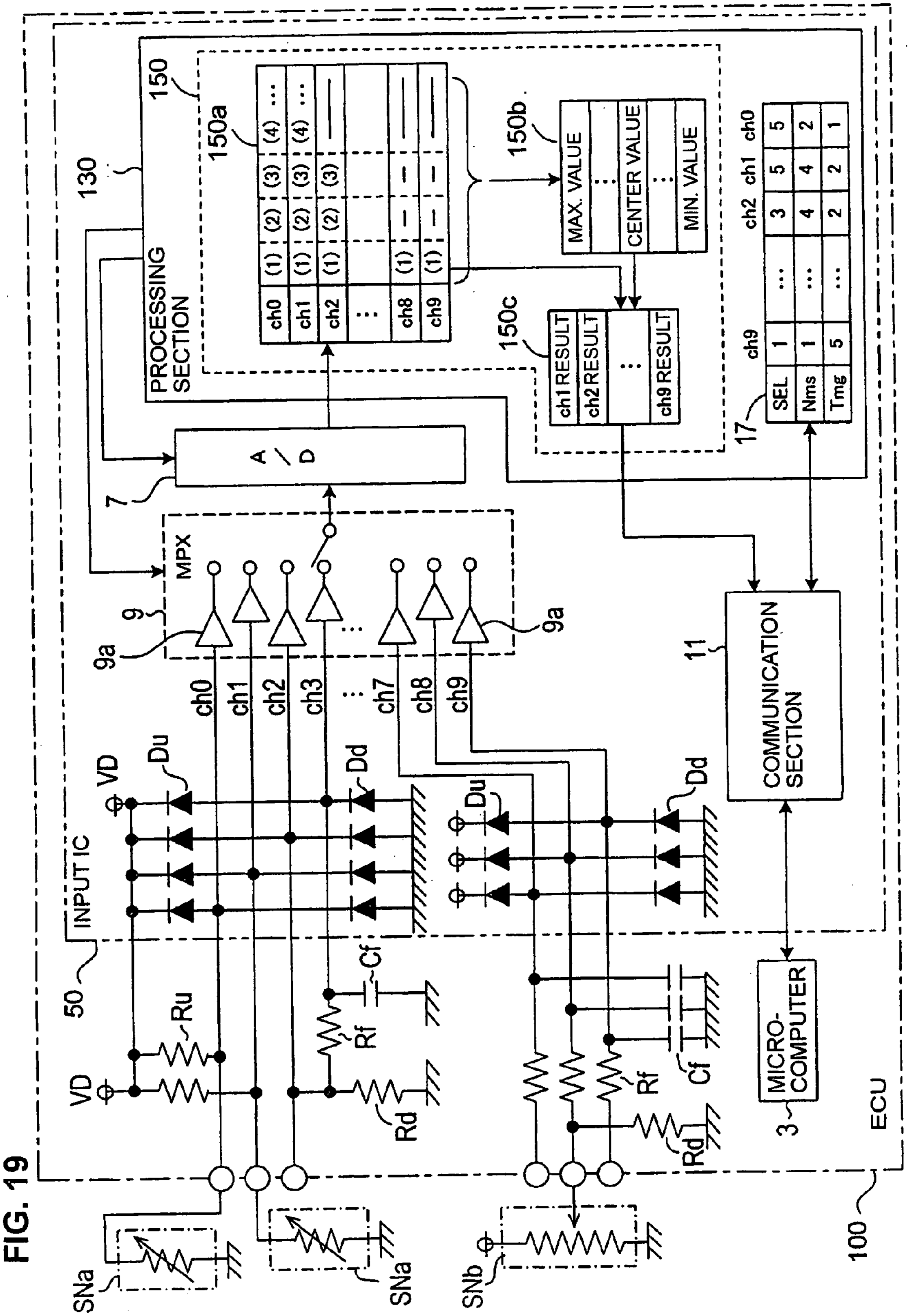
FIG. 19 is a system block diagram of a modified form of the fourth embodiment.

FIG. 19 shows a modified form of the fourth embodiment described above. As shown, the configuration differs from that of FIG. 14 in that a single analog signal is inputted in common to the channels ch2, ch3, and an analog filter circuit (Rf, Cf) is connected in the analog signal line of one of these channels (in FIG. 19, ch3). A two-mode detection signal such as that described above is inputted as this common analog signal.

In this case, the operation of the processing section 130 is predetermined (by setting appropriate values for the variable in the data register 17 as described hereinabove for the fourth embodiment) such that median value calculation processing is executed periodically for channel ch2 (e.g., by steps S350~S410 and S440 of FIG. 15), while the median value calculation processing is not applied to channel ch3, i.e., the channel whose analog signal is subjected to analog filtering for noise removal. Instead, during each interval when an abrupt change occurs in the two-mode detection signal, the microcomputer 3 transmits to the input IC 50 an asynchronous A/D conversion request that specifies channel ch3, so that an A/D conversion will be performed for that channel at the appropriate time.

In that way, by using the channels ch2, ch3 for the two-mode detection signal, channel ch2 can be used to measure the background level of that detection signal, while channel ch3 can be used to measure the abrupt changes in the level of the detection signal. Noise can thereby be effectively excluded from the background level by means of the median value calculation processing, while at the same time, noise is removed only by means of an analog low-pass filter from those parts of the two-mode detection signal where abrupt changes occur. Since the abrupt changes are not subjected to the median value calculation processing, it is ensured that these changes will not be erroneously detected as noise, and hence can be reliably measured.

Such a two-mode detection signal could also be handled as follows. Firstly, that signal would be inputted to a single channel of the A/D converter 7, that is provided with an analog filter circuit, such as channel ch7 in FIG. 14.

Measurement of the background level of the two-mode detection signal would be performed by periodically applying the median value calculation processing of steps S350~S410 and S440 in FIG. 15 to the channel concerned, e.g., ch7. At each interval in which an abrupt change in level of the two-mode detection signal occurs (e.g., when the voltage applied to a sensor element is abruptly changed, as described above) the microcomputer 3 would transmit to the input IC 50 an asynchronous A/D conversion request that specifies channel ch7. When that occurs, an A/D converted value would be derived by the input IC 50, which would not be subjected to median value calculation processing, and would be transmitted directly from the input IC 50 to the microcomputer 3.

In that way it would be possible to use only a single channel for handling a two-mode detection signal, so that the total number of channels can be minimized.

It should be noted that such a two-mode detection signal is not necessarily an air/fuel ratio sensor signal, and could for example be produced from an engine cylinder pressure sensor, or be an ion current signal.

Furthermore with the input IC 50 of the fourth embodiment, instead of utilizing the variable Tmg, it would be equally possible to perform A/D conversions for the respective channels in a fixed sequence of channel numbers (e.g., ch0→ch1→ch2→ . . . ch0→ . . . ) with that sequence being specified by a value which is held in the data register 17, and which is transmitted from the microcomputer 3 and written into the data register 17 by the input IC 50.

Furthermore, with the fourth embodiment, an odd-numbered value is set as SEL in the data register 17, and in step S390 and S400 of FIG. 15, in the same way as for the first embodiment, each median value is selected from an odd number of A/D converted values. However it would be equally possible to arrange that SEL is either an even number of 4 or more, or is 1. In that case, when SEL is an even number, then in the same way as for the alternative form 2 of the first embodiment described above, in step S390 and S400, each final value would be derived based on an even number of most recently obtained A/D converted values. That is to say, with that even number of A/D converted values arranged in order of magnitude, the SEL/2-th and the {(SEL/2)+1}-th from largest value would be detected, and the average of these would be calculated. Factor-based averaging would then be applied to the resultant average value, in accordance with the value that has been set for Nms.

It should thus be understood that although the present invention has been described above referring to specific embodiments, it is not limited in scope to these embodiments, and various modifications could be envisaged.

For example, various values other than 2, 4, 8, etc., could be used as the factor N in the factor-based averaging processing. Furthermore, it would be equally possible to apply some other type of digital smoothing processing, such as moving-average processing, in step S150 of FIG. 4 or step S250 in FIG. 10 in place of factor-based averaging processing.

Furthermore with each of the above embodiments and their described alternative forms, each A/D converted value produced from the A/D converter 7 is stored directly in the converted data memory region 15*a*. However it would be equally possible to apply noise elimination processing of the form described in reference 1 or reference 3 to each of these A/D converted values before storing resultant values in the converted data memory region 15*a*, i.e., to thereby obtain data in which values exceeding a predetermined magnitude have been excluded as being noise.

Moreover with each of the above embodiments and alternative forms (when each final value is derived based on an odd number of most recently obtained A/D converted values) a single A/D converted value is selected as a median value of magnitude of a plurality of A/D converted values, to be used for control purposes. However it is not essential to derive each median value to a high degree of accuracy, as being the exactly central value when the most recently obtained set of A/D converted values is arranged in order of magnitude. For example it would for example be equally possible to arrange that g A/D converted values are held in the region of the converted data memory region 15*a* reserved for a channel (where g is a plural even-numbered integer), and that with these g values arranged in order of magnitude, the g/2-th largest value (i.e., counting from the highest-magnitude one of the g values) is selected, so that for example the third-largest value would be selected, if g=6, or selecting the g/2-th smallest value (i.e., counting from the smallest-magnitude one of the g values), which is equivalent to selecting the {(g/2)+1}-th largest value.

Furthermore if the analog signal contains an especially high level of noise, then for example the second-smallest one of each set of five successively obtained A/D converted values could be selected, to be used for control purposes, instead of the median value.

Moreover with the alternative forms 2 and 3 of the first embodiment described hereinabove, two values which are close to the median value of a set of successively obtained A/D converted values are selected, and the average of these is derived, instead of simply detecting the median value of that set of A/D converted values. However as another possible alternative form, if each set of most recently obtained A/D converted values is made an odd number such as 7 or greater, then the third-largest and fourth-largest (i.e., median), and fifth-largest of the set of values could be respectively detected, and the average of these three values calculated to obtain a result which would be utilized as a final value, rather than utilizing the median value alone.

Similar processing could be applied in the operation of the input IC 50 of the fourth embodiment, shown in FIG. 15.

As a further alternative, if such a plurality of values are selected that are close to the median value of the set of most recently obtained A/D converted values, and the plurality of selected values are mutually close in magnitude, then any one of these could be utilized, instead of deriving their average value.

Moreover with the embodiments and alternative forms thereof described hereinabove, memory regions 15*a*, 15*c* of a RAM 15 are used for storing the A/D converted values and resultant processed values. However any other type of data storage device could be used for that purpose, and also for storing intermediate values used in calculations or sorting processing, such the region 15*b*.

In addition, with the above embodiments and alternative forms, digital sorting processing is applied to derive a median value of a most recently obtained set of A/D converted values, for use (directly, or after smoothing processing) as an updated final value, or digital sorting processing is applied to derive a plurality of values that are close to the median value of such a set of A/D converted values, with the average value of that plurality of values being calculated for use (directly, or after smoothing processing) as an updated final value. However it should be noted that it is not essential to derive an A/D converted value (or average of a plurality of A/D converted values) that is accurately close to the median value of such a set. For that reason, it would be equally possible to use analog processing to identify each A/D converted value that approximates to the median value of such a set. That is to say, a plurality of delay circuits (e.g., formed of resistors and capacitors) could readily be used in conjunction with comparators to operate on an analog signal, with the delay values being appropriately determined in relation to the interval between successive A/D conversion timings of the analog signal, and with the output signals from the delay circuits being compared with one another and with the undelayed analog signal, to identify each point in the analog signal at which an A/D converted value will be derived that approximates to the median value of the aforementioned most recently obtained set of A/D converted values.

It should also be noted that the present invention is not limited in application to an ECU for vehicle engine control purposes, but could be equally applied to an ECU for controlling the transmission of a vehicle, or for controlling devices in fields other than that of motor vehicles.

What is claimed is:

1. An A/D conversion processing apparatus comprising:

A/D (analog-to-digital) converter means for converting an analog signal to a series of digital values expressing successive voltage values of said analog signal;

converted data memory means for storing a most recently derived set of m of said digital values, where m is an integer of value 3 or more, and final result memory means for holding at least one final result value that is derived by said apparatus from said analog signal;

data detection means for operating on said m digital values each time that said digital values are updated in said converted data memory means, to detect a specific-rank value within said set of digital values, having a magnitude that is intermediate between a greatest-magnitude one and a smallest-magnitude one of said digital values in said set; and data processing means for storing said specific-rank value in said final result memory means as an updated final result value.

2. An A/D conversion processing apparatus according to claim 1, wherein said value m is an odd number, and wherein said specific-rank one of said set of digital values is a median value of said set when said set of digital values are arranged in order of magnitude.

3. An A/D conversion processing apparatus according to claim 1, wherein said data processing means performs digital smoothing processing of said specific-rank values to reduce variations in magnitude thereof, and stores each result obtained from said digital smoothing processing in said final result memory means as an updated one of said final result values.

4. An A/D conversion processing apparatus comprising:

A/D (analog-to-digital) converter means for converting an analog signal to a series of digital values expressing successive voltage values of said analog signal, converted data memory means for storing a most recently derived set of m of said digital values, where m is an integer of value 4 or more, and final result memory means for storing at least one result value derived by said apparatus from said analog signal, as a final result value, data detection means for operating on said m digital values each time that said digital values are updated in said converted data memory means, to detect a plurality of specific-rank value within said set of digital values, each of said specific-rank values having a magnitude that is intermediate between a greatest-magnitude one and a smallest-magnitude one of said digital values in said set, and for deriving an average value of said plurality of specific-rank values, and data processing means for storing said average value in said final result memory means as an updated one of said final result values.

5. An A/D conversion processing apparatus according to claim 4, wherein said plurality of specific-rank values are selected as being close in magnitude to a median value of magnitude of said set of digital values.

6. An A/D conversion processing apparatus according to claim 4, wherein said data processing means performs reduction of variations in magnitude between successive ones of said specific-rank values, by applying digital smoothing processing to said specific-rank values and stores each result values obtained from said smoothing processing in final result memory means as an updated one of said final result values.

7. An A/D conversion processing apparatus according to claim 1, wherein said A/D converter means is controlled to perform said A/D conversions of said analog signal at successive intervals which vary in duration.

8. An A/D conversion processing apparatus according to claim 7, wherein said A/D converter means is controlled to perform said A/D conversions at successive intervals which vary randomly in duration.

9. An A/D conversion processing apparatus according to claim 7, wherein said A/D converter means is controlled to perform said A/D conversions at successive intervals which vary in duration in a cyclically recurring sequence.

10. An A/D conversion processing apparatus according to claim 1, said final result values being utilized by a control apparatus in performing control operations, wherein:

said A/D conversion processing apparatus comprises communication means for performing data communication with said control apparatus, and each of said means of said A/D conversion processing apparatus other than said communication means operate at timings that are independent of operation timings of said control apparatus, and said A/D conversion processing apparatus is responsive to a data acquisition request received from said control apparatus by communication via said communication means for transmitting to said control apparatus a most recently updated one of said final result values that has been stored in said final result memory means.

11. An A/D conversion processing apparatus according to claim 1, said final result values being utilized by a control apparatus in performing control operations, wherein:

said A/D conversion processing apparatus comprises communication means for performing data communication with said control apparatus at successive timings occurring at fixed periodic intervals, each of said means of said A/D conversion processing apparatus other than said communication means repetitively begin to operate at successive timings that each precede, by a predetermined interval, a corresponding one of said timings of performing said data communication with said control apparatus, and when each of said timings of data communication with said control apparatus occurs, said A/D conversion processing apparatus reads out a most recently updated one of said final result values from said final result memory means, and transmits said final result value to said control apparatus via said communication means.

12. An A/D conversion processing apparatus according to claim 1, wherein:

said A/D converter means comprises a plurality of input terminals having respective ones of a plurality of analog signals coupled thereto and multiplexing means for successively selecting said analog signals, to be respectively subjected to A/D conversion, in a first set of said input terminals, comprising at least one of said input terminals, each input terminal is coupled to a corresponding filter circuit through which a corresponding one of said analog signals is transferred to said input terminal, for effecting reduction of electrical noise, in a second set of said input terminals, comprising at lest one of said input terminals, a corresponding one of said analog signals is applied directly to each said input terminal, for each analog signal that is coupled to one of said second set of input terminals, said operations performed by said converted data memory means, said data detection means, said data processing means and said final result memory means are applied to each digital value derived by said A/D converter means from said analog signal, and for each analog signal that is coupled via a filter circuit to one of said first set of input terminals, of said operations performed by said converted data memory means, said data detection means, said data processing means and said final result memory means, at least said operations performed by said data detection means are omitted from being applied to each digital value derived by said A/D converter means from said analog signal.

13. An A/D conversion processing apparatus according to claim 12, wherein:

each analog signal that is coupled via a filter to one of said first set of input terminals is a signal which exhibits a maximum rate of variation in amplitude that is relatively large, and each analog signal that is coupled to one of said second set of input terminals is a signal which exhibits a maximum rate of variation in amplitude that is substantially smaller than that of said analog signals which are coupled to said first set of input terminals.

14. An A/D conversion processing apparatus according to claim 12, wherein an analog signal that is coupled via a filter to one of said first set of input terminals is a signal which exhibits variations in amplitude that are not synchronized with a timebase.

15. An A/D conversion processing apparatus according to claim 12, wherein an analog signal that is applied to one of said second set of input terminals is a signal that is produced by voltage division of a power supply voltage of said A/D converter means.

16. An A/D conversion processing apparatus according to claim 12, wherein:

a single analog signal comprises background level intervals and abrupt variation intervals, with said analog signal exhibiting a relatively low rate of change in amplitude during said background level intervals and a relatively high rate of change in amplitude during said abrupt variation intervals;

said analog signal is coupled via a filter circuit, for reduction of electrical noise, to one of said first set of input terminals, and is directly connected to one of said second set of input terminals;

digital values derived from said analog signal by said A/D converter means during said background level intervals are subjected to said operations of said converted data memory means, said data detection means, said data processing means and said final result memory means, to thereby obtain final result values representing said analog signal during said background level intervals; and digital values derived from said analog signal by said A/D converter means during said abrupt variation intervals are subjected to processing whereby, of said operations performed by said converted data memory means, said data detection means, said data processing means and said final result memory means, at least said operations performed by said data detection means are omitted, to thereby obtain final result values representing said analog signal during said abrupt variation intervals.

17. An A/D conversion processing apparatus according to claim 1, comprising data register means, wherein:

at least one of said number m and the duration of an interval between successive A/D conversions performed by said A/D converter means is a variable, respective values for said variables are supplied from an external source, and said supplied values for said variables are stored in said data register means.

18. An electronic control apparatus comprising an A/D conversion processing apparatus according to claim 14, and a control apparatus which utilize said final result values in performing control operations on a control object, wherein:

said analog signal conveys information relating to said control object, and when operation of said electronic control apparatus is started, said control apparatus supplies initial values for said variables to said A/D conversion processing apparatus, to be stored in said data register means.

19. An electronic control apparatus according to claim 18, wherein said control apparatus supplies altered values for said variables to said A/D conversion processing apparatus, to update said values stored in said data register means, on at least one occasion subsequent to supplying of said initial values, said altered values being determined in accordance with a condition of said control object.

20. An electronic control apparatus according to claim 18, wherein said control apparatus:

acquires respective values for said variables from said A/D conversion processing apparatus, read out from said data register means, on at least one occasion subsequent to supplying of said initial values, and compares said values for said variables obtained from said A/D conversion processing apparatus with respective values for said variables that had most recently been supplied from said control apparatus to said A/D conversion processing apparatus.

21. An electronic control apparatus according to claim 20, wherein said control apparatus deletes at least a most recently received set of said final result values transmitted from said A/D conversion processing apparatus when it is judged, based on said comparison of values, that at least one of said values for said variables obtained from said A/D conversion processing apparatus is not identical to a corresponding one of said most recently supplied values for said variables.

22. A method of utilizing an electronic control apparatus as claimed in claim 1, to process a single analog signal that comprises background level intervals and abrupt variation intervals, with said analog signal exhibiting a relatively low rate of change in amplitude during said background level intervals and a relatively high rate of change in amplitude during said abrupt variation intervals, the method comprising:

inputting said analog signal to said A/D converter means via a filter circuit, for reduction of electrical noise, during each of said abrupt variation intervals, and inputting said analog signal directly to said A/D converter means during each of said background level intervals;

performing processing of digital values derived from said analog signal by said A/D converter means during said background level intervals, through said operations of said converted data memory means, said data detection means, said data processing means and said final result memory means, to obtain final result values representing said analog signal during said background level intervals; and performing processing of digital values derived from said analog signal by said A/D converter means during said abrupt variation intervals, with at least said operations of said data detection means being omitted from said operations performed by said converted data memory means, said data detection means, said data processing means and said final result memory means, to obtain final result values representing said analog signal during said abrupt variation intervals.

23. A method of processing an analog signal containing electrical noise to derive a series of final result values, representing said analog signal, as respective digital values that are substantially unaffected by said electrical noise, the method comprising:

performing A/D (analog-to-digital) conversion of said analog signal to derive successive A/D converted values, storing, in a memory, a set of A/D converted values comprising a currently derived one of said A/D converted values and a fixed plurality of precedingly derived ones of said A/D converted values, performing sorting processing to arrange at least a part of said set of A/D converted values in order of magnitude, and selecting a one of said set of A/D converted values having a magnitude that is intermediate between a maximum magnitude and a minimum magnitude of said set of A/D converted values;

wherein said selected one of the set of A/D converted values constitutes a currently derived one of said final result values.

24. A method of processing an analog signal as claimed in claim 23, wherein said set of A/D converted values comprises an odd number of values, and wherein said currently derived final result value is selected as having a median value of magnitude within said set.

25. A method of processing an analog signal as claimed in claim 23, further comprising applying digital smoothing processing to successively derived ones of said values selected from the set of A/D converted values, with result values obtained from said smoothing processing constituting respective ones of said final result values.

26. A method of processing an analog signal as claimed in claim 25 wherein said digital smoothing processing comprises, for each said value selected from said set of A/D converted values:

multiplying an immediately precedingly derived one of said final result values by a value that is smaller by one than a predetermined fixed factor, to obtain a multiplication result, adding said multiplication result to said value that has been selected from said set, and dividing a result obtained thereby by said fixed factor to obtain a division result, wherein said division result constitutes said currently derived final result value.

27. A method of processing an analog signal containing electrical noise to derive a series of final result values, representing said analog signal, as respective digital values that are substantially unaffected by said electrical noise, the method comprising:

performing A/D (analog-to-digital) conversion of said analog signal to derive successive A/D converted values, storing, in a memory, a set of A/D converted values comprising a currently derived one of said A/D converted values and a fixed plurality of precedingly derived ones of said A/D converted values, performing sorting processing to arrange at least a part of said set of A/D converted values in order of magnitude, selecting a plurality of said set of A/D converted values, each having a magnitude that is intermediate between a maximum magnitude and a minimum magnitude of said set of A/D converted values, and calculating an average value of said selected plurality of A/D converted values, wherein said average values constitutes a currently derived one of said final result values.

28. A method of processing an analog signal as claimed in claim 27, wherein said set of A/D converted values comprises an odd number of values, and wherein said steps of selecting said plurality of A/D converted values and calculating said average value comprise:

selecting a one of said set of A/D converted values having a median value of magnitude within said set, selecting a plurality of A/D converted values that include said median value and successively increase in magnitude, from within said set, and calculating an average value of said selected plurality of values, as said currently derived final result value.

29. A method of processing an analog signal as claimed in claim 27, wherein said set of A/D converted values comprises an even number of values, and wherein said steps of selecting said plurality of A/D converted values and calculating said average value comprise:

selecting a plurality of values from said set, having respective magnitudes that are each intermediate between said maximum magnitude and minimum magnitude, and calculating an average value of said selected plurality of values, as said currently derived final result value.

30. A method of processing an analog signal as claimed in claim 27, further comprising applying digital smoothing processing to successively derived ones of said values selected from the set of A/D converted values, to thereby obtain successive ones of said final result values.

31. A method of processing an analog signal as claimed in claim 27 wherein said digital smoothing processing comprises, for each said value selected from said set of A/D converted values:

multiplying an immediately precedingly derived one of said final result values by a value that is smaller by one than a predetermined fixed factor, to obtain a multiplication result, adding said multiplication result to said value that has been selected from said set, and dividing a result obtained thereby by said fixed factor to obtain a division result, wherein said division result constitutes said currently derived final result value.

32. An electronic control apparatus for controlling a control object, with information conveyed by at least one analog signal being utilized in effecting said control, the electronic control apparatus comprising:

an A/D (analog-to-digital) conversion processing apparatus for processing said analog signal to derive a series of final result values, said final result values comprising respective digitized values representing successive voltage values of said analog signal with effects of electrical noise excluded therefrom, said processing being performed based upon respective values of a set of variables comprising at least one variable, and said A/D conversion processing apparatus comprising register means for storing said values of said variables; and a control apparatus coupled for communication with said A/D conversion processing apparatus, for receiving said final result values and controlling said control object based upon control input data that include said final result values, for determining appropriate respective values for said variables based upon a status of said control object, and for supplying said values for said variables to said A/D conversion processing apparatus to be stored in said register means.

33. An electronic control apparatus according to claim 32, wherein said A/D conversion processing apparatus comprises:

A/D converter means for repetitively performing operations to convert an analog signal to successive digital values expressing respective voltage values of said analog signal, with a specific repetition period, converted data memory means for storing a most recently derived set of m of said digital values, where m is an integer of value 3 or more, and final result memory means for holding at least one result value derived by said apparatus from said analog signal, as a final result value, data detection means for operating on said m digital values each time that said digital values are updated in said converted data memory means, to detect a set of specific-rank values within said set of digital values, said set comprising at least one specific-rank value, each said specific-rank value having a magnitude that is intermediate between a greatest-magnitude one and a smallest-magnitude one of said digital values in said set, and data processing means for deriving an updated final result value from said set of specific-rank values, and storing said updated final result value in said final result memory means, wherein at least one of said repetition period and said integer m is a variable whose value is held stored in said register means.

34. An electronic control apparatus according to claim 33, wherein said data processing means of said A/D conversion processing apparatus performs digital smoothing processing of respective result values derived from successive ones of said sets of specific-rank values, to thereby derive respective ones of said final result values.

35. An electronic control apparatus according to claim 34, wherein said digital smoothing processing is performed by a calculation that is based on a predetermined factor, and wherein said factor is one of said variables whose values are held stored in said register means.

36. An electronic control apparatus according to claim 33, wherein said value m is an odd number, and wherein each said final result value is derived as a median value of one of said sets of digital values, when said values of said set are arranged in order of magnitude.

37. An electronic control apparatus according to claim 33, wherein said value m is an even number, and wherein each said final result value is derived as an average value of a plurality of values selected from within one of said sets of digital values, said plurality comprising values other than a maximum and a minimum value, when said values of said set are arranged in order of magnitude.

38. An A/D conversion processing apparatus comprising:

A/D (analog-to-digital) converter means for converting an analog signal to a series of digital values expressing successive voltage values of said analog signal, said analog signal being utilized in controlling a control object;

memory means for storing a most recently derived set of m of said digital values, where m is an integer of value 3 or more;

data detection means for operating on said m digital values each time that said digital values are updated in said memory means, to detect a value within said set of digital values, having a magnitude that is intermediate between a greatest-magnitude one and a smallest-magnitude one of said digital values in said set; and processing means for deriving control data that are used in controlling said control object, based on said values detected by said data detection means.

* * * * *